United States Patent
Huh et al.

(10) Patent No.: US 11,810,852 B2
(45) Date of Patent: Nov. 7, 2023

(54) MODULE SUBSTRATE FOR SEMICONDUCTOR MODULE AND SEMOCONDUCTOR MEMORY MODULE

(71) Applicant: SAMSUNG ELECTRONICS CO., LTD., Suwon-si (KR)

(72) Inventors: Daae Huh, Seoul (KR); Dongyeop Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/707,267

(22) Filed: Mar. 29, 2022

(65) Prior Publication Data

US 2023/0066242 A1 Mar. 2, 2023

(30) Foreign Application Priority Data

Aug. 27, 2021 (KR) .......................... 10-2021-0113910

(51) Int. Cl.
| | |
|---|---|
| *H01L 23/522* | (2006.01) |
| *H01L 23/64* | (2006.01) |
| *H01L 25/18* | (2023.01) |
| *H05K 1/16* | (2006.01) |

(52) U.S. Cl.
CPC ................. *H01L 23/5223* (2013.01)

(58) Field of Classification Search
CPC ............. H01L 23/5223; H01L 23/5222; H01L 23/5226; H01L 23/642; H01L 25/18; H01L 28/40; H01L 28/60; H05K 1/162
See application file for complete search history.

(56) References Cited

U.S. PATENT DOCUMENTS

| | | | |
|---|---|---|---|
| 7,317,503 B2 * | 1/2008 | Lee | G02F 1/134363 349/146 |
| 8,643,184 B1 | 2/2014 | Zhang et al. | |
| 9,105,635 B2 | 8/2015 | Altunyurt et al. | |
| 9,627,787 B2 | 4/2017 | Becker et al. | |
| 10,103,054 B2 | 10/2018 | Zhang et al. | |
| 10,230,183 B2 | 3/2019 | Sankararaman | |
| 10,536,127 B2 | 1/2020 | Kim et al. | |
| 10,716,210 B2 | 7/2020 | Barnette et al. | |
| 2002/0118523 A1 * | 8/2002 | Okabe | H05K 1/162 361/793 |
| 2013/0215588 A1 | 8/2013 | Kawai | |

(Continued)

FOREIGN PATENT DOCUMENTS

| | | |
|---|---|---|
| KR | 1020180047857 A | 5/2018 |
| KR | 1020200029680 A | 3/2020 |

*Primary Examiner* — Omar F Mojaddedi
(74) *Attorney, Agent, or Firm* — Sughrue Mion, PLLC

(57) ABSTRACT

A substrate for semiconductor module includes a plurality of insulating layers sequentially stacked on one another, N signal lines transmitting N signals respectively, the N signal lines having N vias that at least partially penetrate through the plurality of insulating layers and are arranged in an N-sided polygon shape in a plan view, and a capacitor element configured to provide capacitive coupling between the N signal lines, the capacitor element having a first coupling element that provides capacitive coupling between first and second vias adjacent to each other among the N vias and a second coupling element that provides capacitive coupling between third and fourth vias that are not adjacent to each other among the N vias.

20 Claims, 16 Drawing Sheets

(56) References Cited

U.S. PATENT DOCUMENTS

| | | | |
|---|---|---|---|
| 2014/0268614 A1* | 9/2014 | Zhang | H01L 23/50 |
| | | | 174/262 |
| 2017/0062960 A1* | 3/2017 | Becker | H05K 1/141 |
| 2018/0103226 A1* | 4/2018 | Raynor | H01L 27/14643 |
| 2019/0252322 A1* | 8/2019 | Braunisch | H01L 23/5383 |
| 2020/0020635 A1* | 1/2020 | Chang | H01L 23/5226 |
| 2020/0084881 A1* | 3/2020 | Lee | H05K 1/181 |

* cited by examiner

MODULE SUBSTRATE FOR SEMICONDUCTOR MODULE AND SEMOCONDUCTOR MEMORY MODULE

CROSS-REFERENCE TO RELATED APPLICATION(S)

This application claims priority under 35 U.S.C. § 119 to Korean Patent Application No. 10-2021-0113910, filed on Aug. 27, 2021 in the Korean Intellectual Property Office (KIPO), the contents of which are herein incorporated by reference in their entirety.

BACKGROUND

1. Field

Example embodiments relate to a substrate for a semiconductor module and a semiconductor memory module including the substrate. More particularly, example embodiments relate to a substrate for mounting a plurality of different semiconductor memory packages thereon and a semiconductor memory including the same.

2. Description of the Related Art

As semiconductor memory module products are required to have higher specifications, the density of signals in semiconductor products increases. Accordingly, crosstalk, which is an interference phenomenon between signals, occurs, and the signal is distorted, thereby degrading the product characteristics. In order to prevent crosstalk, a method of maximally separating a distance between wires through which signals are transmitted has been adopted, but there is a problem in that there is a spatial limitation.

SUMMARY

Example embodiments provide a substrate for a semiconductor module capable of preventing interference between signal lines.

Example embodiments provide a semiconductor memory module including the substrate.

According to an aspect of the disclosure, there is provided a substrate for semiconductor module, including: a plurality of insulating layers provided in a sequentially stacked arrangement; N signal lines transmitting N signals respectively, the N signal lines having N vias that at least partially penetrate through the plurality of insulating layers, the N vias being arranged in an N-side polygon shape in a plan view; and a capacitor element configured to provide capacitive coupling between the N signal lines, the capacitor element having a first coupling element configured to provide capacitive coupling between a first via and a second via adjacent to each other among the N vias and a second coupling element configured to provide capacitive coupling between a third via and a fourth via that are not adjacent to each other among the N vias, wherein the first coupling element includes a first capacitive pattern extending from the first via toward the second via and a second capacitive pattern extending from the second via toward the first via, and the second coupling element includes a third capacitive pattern extending from the third via toward the fourth via and a fourth capacitive pattern extending from the fourth via toward the third via, wherein the first capacitive pattern and the second capacitance pattern are provided in different insulating layers of the plurality of insulating layers, and a first region of the first capacitive pattern overlaps a second region of the second capacitance pattern in the plan view, and wherein the third capacitive pattern and fourth capacitance pattern are provided in different insulating layers of the plurality of insulating layers, and a third region of the third capacitive pattern overlaps a fourth region of the fourth capacitance pattern in the plan view.

According to an aspect of the disclosure, there is provided a substrate for semiconductor module, including: a plurality of insulating layers sequentially arranged in a vertical direction; N signal lines transmitting N signals respectively, the N signal lines having N vias that at least partially penetrate through the plurality of insulating layers and are arranged in an N-sided polygon shape in a plan view, N being a natural number greater than 3; and at least one capacitor element having a first capacitive pattern extending from a first via of the N vias in a first horizontal direction and a second capacitance pattern extending from a second via of the N vias in a second horizontal direction parallel to the first horizontal direction, the first and second capacitive patterns configured to provide capacitive coupling between the first via and the second via, wherein the first and second capacitive patterns provided in different insulating layers of the plurality of insulating layers, and the first and second capacitive patterns extend within the N-sided polygon shape in the plan view.

According to an aspect of the disclosure, there is provided a semiconductor device, including: a substrate having a plurality of layers stacked in a vertical direction; and one or more memory packages provided on the substrate, wherein the substrate includes: a plurality of signal lines penetrating the substrate in the vertical direction, the plurality of signal lines having a plurality of vias arranged in a circumferential direction at predetermined intervals around a center of the vias; and a first coupling element and a second coupling element configured to provide capacitive coupling between the signal lines, the first coupling element configured to provide capacitive coupling between first and second vias that are sequentially arranged to be adjacent with each other in the circumferential direction, the second coupling element configured to provide capacitive coupling between third and fourth vias that are not sequentially arranged each other in the circumferential direction, wherein the first coupling element includes a first capacitive pattern extending from the first via toward the second via and a second capacitive pattern extending from the second via toward the first via, wherein the second coupling element includes a third capacitive pattern extending from the third via toward the fourth via and a fourth capacitive pattern extending from the fourth via toward the third via, wherein the first capacitive pattern and second capacitive pattern are provided in different layers of the plurality of layers and a first region of the first capacitive pattern overlaps a second region of the second capacitance pattern in the vertical direction, and wherein the third capacitive pattern and fourth capacitive pattern are provided in different layers of the plurality of layers and a third region of the third capacitive pattern overlaps a fourth region of the fourth capacitance pattern in the vertical direction.

According to example embodiments, a substrate for semiconductor module may include a plurality of insulating layers sequentially stacked on one another, N signal lines transmitting N signals respectively and having N vias that at least partially penetrate through the plurality of insulating layers and are arranged in an N-sided polygon shape in a plan view, and a capacitor element including a plurality of coupling elements providing capacitive coupling between the N signal lines.

Thus, the coupling elements provided between the signal lines may form capacitive coupling between the signal lines, and may compensate for a difference in speeds of signals moving along the signal lines to improve signal characteristics. In addition, it may be easy to configure a combination of the patterns, size, shape, arrangement, etc. according to the required degree of capacitive coupling, and the signal may be compensated even in a structure in which crosstalk easily occur.

BRIEF DESCRIPTION OF THE DRAWINGS

Example embodiments will be more clearly understood from the following detailed description taken in conjunction with the accompanying drawings.

FIG. 1 is a block diagram illustrating a computing device in accordance with example embodiments.

FIG. 2 is a diagram illustrating semiconductor memory module in accordance with example embodiments.

FIG. 3 is a diagram illustrating signal lines connected from a memory controller to a main memory in accordance with example embodiments.

FIG. 4 is a diagram illustrating a signal combiner of FIG. 1 in accordance with example embodiments.

FIG. 5 is a diagram illustrating an arrangement of signals of FIG. 4 in accordance with example embodiments.

FIG. 6 is a diagram illustrating a signal combiner of FIG. 1 in accordance with example embodiments.

FIG. 7 is a diagram illustrating an arrangement of signals of FIG. 6 in accordance with example embodiments.

FIG. 8 is a cross-sectional view illustrating layers of a substrate in accordance with example embodiments.

FIG. 9 is a cross-sectional view illustrating an attachment region of vias in accordance with example embodiments.

FIG. 10 is a perspective view illustrating capacitive couplings in accordance with example embodiments.

FIG. 11 is a cross-sectional view illustrating along line I-I' in FIG. 9.

FIG. 12 is a cross-sectional view illustrating along line II-IF in FIG. 9.

FIG. 13 is a cross-sectional view illustrating along line in FIG. 9.

FIG. 14 is a cross-sectional view illustrating along line IV-IV' in FIG. 9.

FIGS. 15 to 18 are detailed views illustrating layers in FIG. 8.

DETAILED DESCRIPTION OF EXAMPLE EMBODIMENTS

Hereinafter, example embodiments will be explained in detail with reference to the accompanying drawings.

Figure 1:
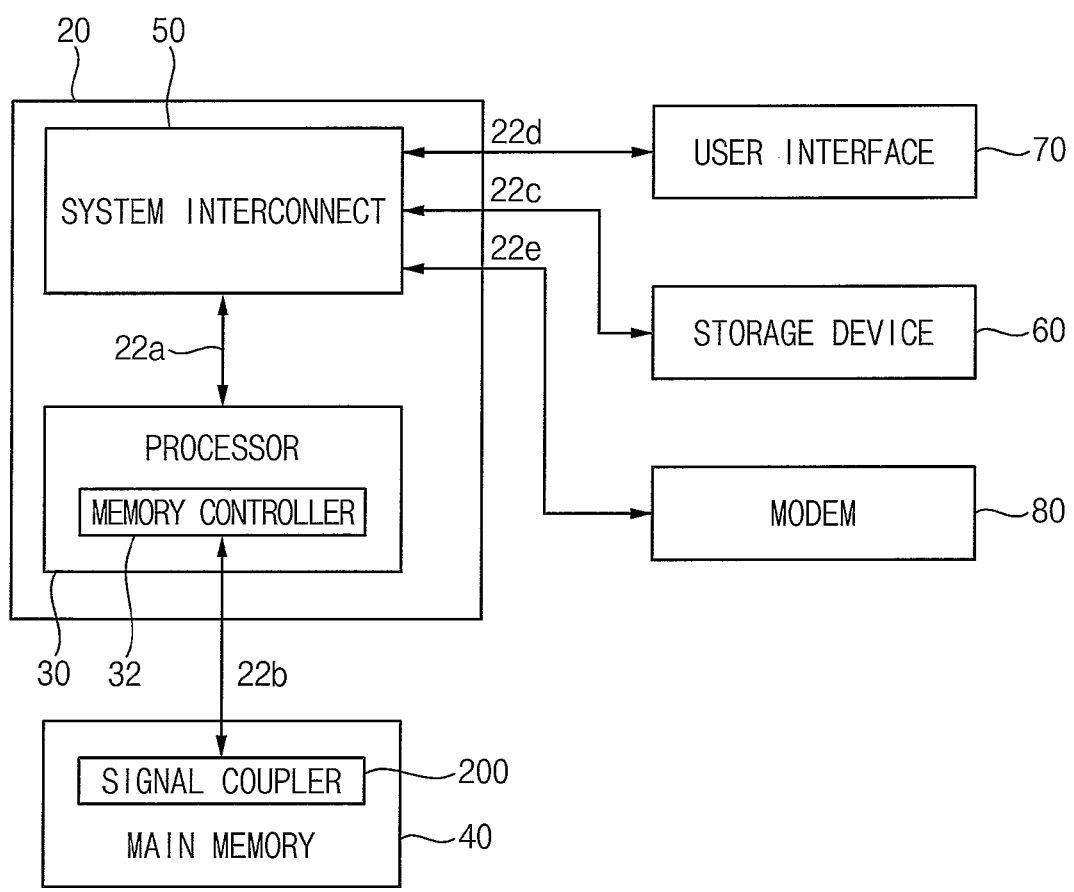
FIGS. 1 to 18 represent non-limiting, example embodiments as described herein.
Figure 2:
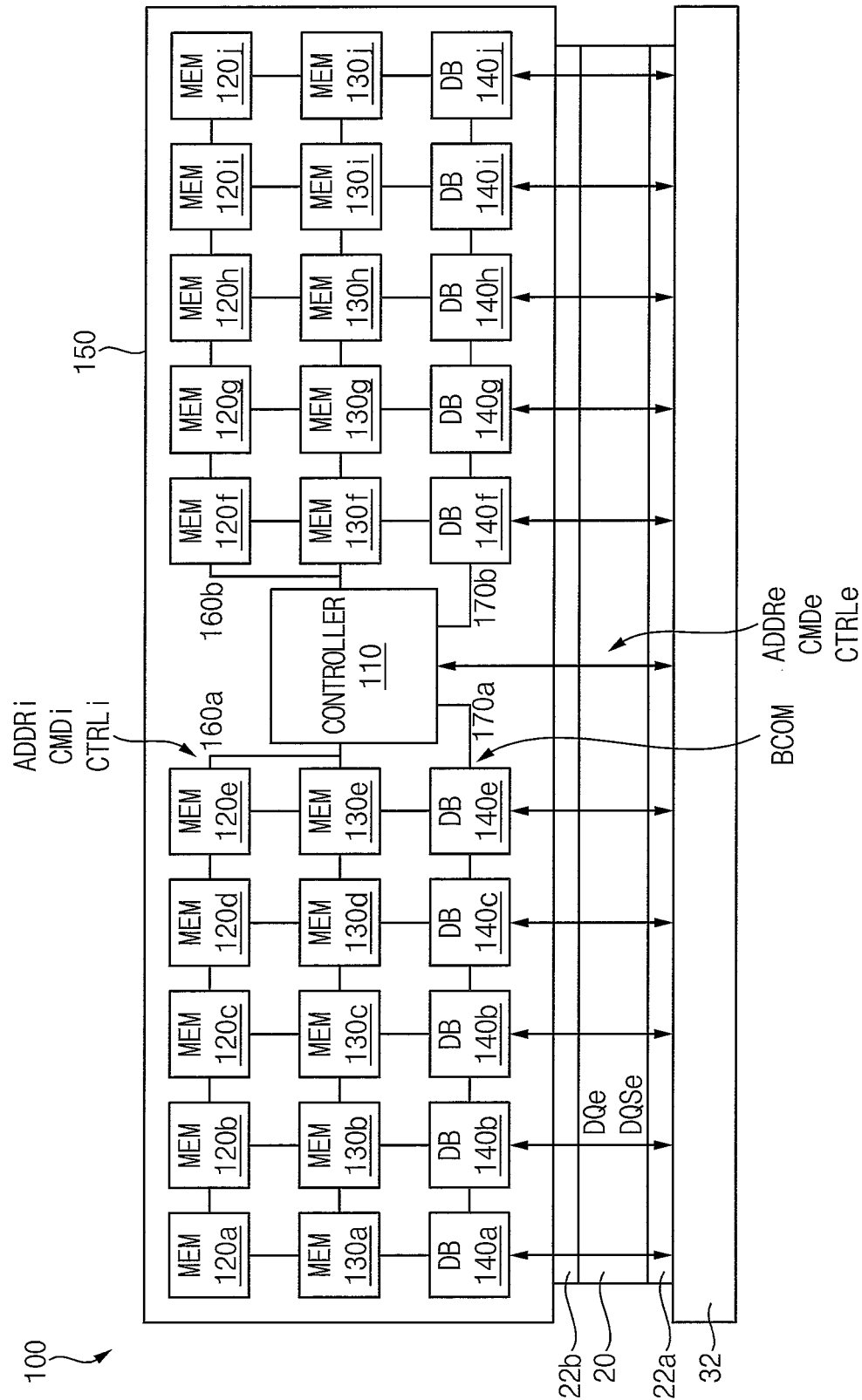
Figure 3:
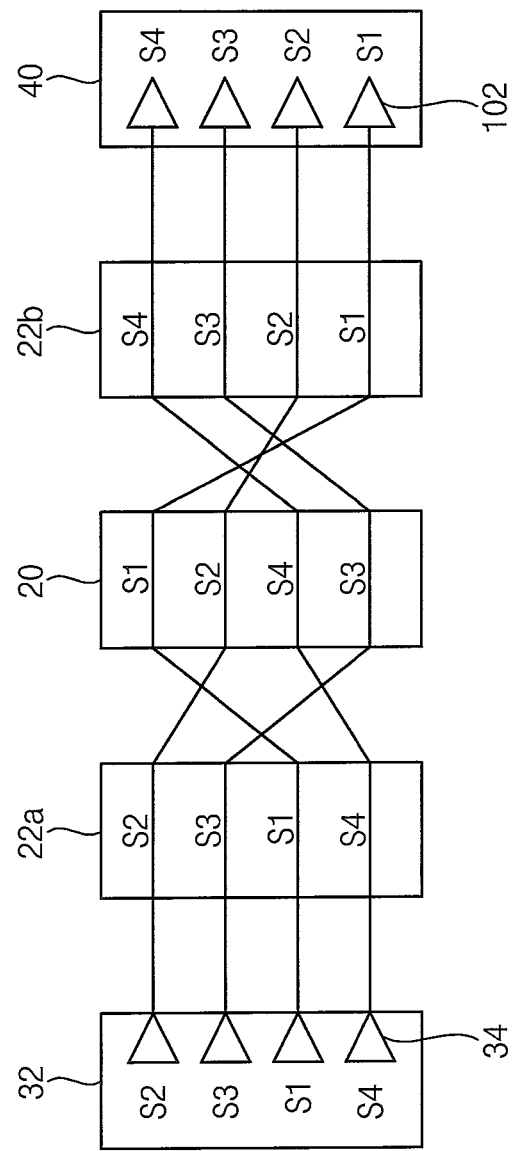

FIG. 1 is a block diagram illustrating a computing device in accordance with example embodiments. FIG. 2 is a block diagram illustrating a semiconductor memory module in accordance with example embodiments. FIG. 3 is a block diagram illustrating signal lines connecting a memory controller to a main memory in accordance with example embodiments.

Referring to FIGS. 1 to 3, a computing device 10 may include a board 20, a processor 30, a main memory 40, a system interconnect 50, a storage device 60, a user interface 70, and a modem 80.

The board 20 may be a mother board on which the processor 30 and the system interconnect 50 are mounted. The board 20 may include first to fifth connectors 22a, 22b, 22c, 22d and 22e, which connect the processor 30, the main memory 40, the storage device 60, the user interface 70, and the modem 80 respectively. The board 20 may be fabricated to include system interconnect 50. According to another example embodiment, the board 20 may be a mother board on which the processor 30, the main memory 40, the system interconnect 50, the storage device 60, the user interface 70, and the modem 80 are mounted.

The processor 30 may include a central processing unit (CPU) or an application processor configured to control the computing device 10 and perform various operations. The processor 30 may include a memory controller 32 configured to control the main memory 40. The processor 30 may store codes necessary for performing the operations and data accompanying the operations in the main memory 40.

The main memory 40 may be connected to the board 20 through the second connector 22b. The main memory 40 may include dynamic random access memory (DRAM). The main memory 40 may be a storage class memory (SCM) including a nonvolatile memory such as a flash memory or a phase change memory. The main memory 40 may be based on a dual in-line memory module (DIMM).

The main memory 40 may include a signal coupler 200. The signal coupler 200 may provide capacitive coupling between signal lines in communication with the memory controller 32. The signal coupler 200 may prevent crosstalk between the signal lines by the capacitive coupling.

The system interconnect 50 may provide channels between the processor 30, the storage device 60, the user interface 70 and the modem 80. The system interconnect 50 may be based on one of a variety of standards, including Peripheral Component Interconnect express (PCIe), Non-volatile Memory express (NVMe), Advanced eXtensible Interface (AXI), ARM Microcontroller Bus Architecture (AMBA), etc.

The storage device 60 may be connected to the board 20 through the third connector 22c. The storage device 60 may operate as a secondary memory of the computing device 10. The storage device 60 may store an operating system driven by the processor 30, applications, and original sources of user data. The storage device 60 may include a hard disk drive (HDD), a solid state drive (SSD) and an optical disk drive (ODD).

The user interface 70 may be connected to the board 20 through the fourth connector 22d. The user interface 70 may be configured to exchange information with a user. The user interface 70 may include a user input interface for receiving information from a user, such as a keyboard, a mouse, a touch panel, a motion sensor, a microphone, etc. The user interface 70 may include a user output interface for providing information to a user, such as a display device, a speaker, a beam projector, a printer, etc.

The modem 80 may be connected to the board 20 through the fifth connector 22e. The modem 80 may be configured to exchange data with an external device wirelessly or wired. For example, the modem 80 may be provided to be integrated with the substrate 20 or the processor 30.

In example embodiments, the semiconductor memory module 100 illustrated in FIG. 2 may be used as the main memory 40. Referring to FIG. 2, the semiconductor memory module 100 may include a controller 110, first memory devices (MEMS) 120a to 120j, second memory devices (MEMs) 130a to 130j, and data buffers 140a to 140j.

The controller 110, the first memory devices 120a to 120j, the second memory devices 130a to 130j, and the data buffers 140a to 140j may be implemented by different semiconductor memory packages, and may be respectively provided on one surface of a substrate 150. The first memory devices 120a to 120j may be provided on an upper surface of the substrate 150, and the second memory devices 130a to 130j may be provided on a lower surface of the substrate 150. For example, each of the first memory devices 120a to 120j and the second memory devices 130a to 130j may include a dynamic random access memory (DRAM), a phase change random access memory (PRAM), a flash memory, etc.

The controller 110 may receive an external address (AD-DRe), an external command (CMDe), and external control signals (CTRLe) from the external memory controller 32 through the first connector 22a, the board 20 and the second connector 22b. The external address (ADDRe) may be received in the form of a set of address signals, and the external command (CMDe) may be received in the form of a set of command signals.

The controller 110 may convert the external address (ADDRe), the external command (CMDe) and the external control signals (CTRLe) to an internal address (ADDRi), an internal command (CMDi) and an internal control signals (CTRLi) and transmit through the first control signal lines 160a and 160b to the first memory devices 120a to 120j and the second memory devices 130a to 130j.

The controller 110 may control the first memory devices 120a to 120j and the second memory devices 130a to 130j using the internal address (ADDRi), the internal command (CMDi), and the internal control signals (CTRLi).

The controller 110 may transmit a buffer command (BCOM) to the data buffers 140a to 140j through the second control signal lines 170a and 170b in response to the external command (CMDe) and the external control signals (CTRLe). The controller 110 may control the data buffers 140a to 140j using the buffer command BCOM.

The first memory devices 120a to 120j and the second memory devices 130a to 130j may be respectively connected to the data buffers 140a to 140j. The first memory devices 120a to 120j and the second memory devices 130a to 130j may exchange internal data signals (DQi) and internal data strobe signals (DQSi) with the data buffers 140a to 140j.

The data buffers 140a to 140j may exchange an external data signals (DQe) and an external data strobe signal (DQSe) with the memory controller 32 by the first connector 22a, the board 20, and the second connector 22b.

The semiconductor memory module 100 may communicate the external address (ADDRe), the external command (CMDe), the external control Signals CTRLe, the external data signals (DQe), and the external data strobe signals (DQSe) with the memory controller 32 through the first connector 22a, the board 20 and the second connector 22b.

The substrate 150 of the semiconductor memory module 100 may be configured to provide multiple orders of capacitive coupling to the signal lines of the external address (ADDRe), the external command (CMDe), the external control signals (CTRLe), the external data signals (DQe), and the external data strobe signals (DQSe) to prevent crosstalk therebetween.

Referring to FIG. 3, transmitters 34 of the memory controller 32 may be connected to receivers 102 of the main memory 40 (that may be implemented by main memory module 100) through the first connector 22a, the substrate 20 and the second connector 22b. Likewise, the receivers of the memory controller 32 may also be connected to transmitters of the main memory 40 through the first connector 22a, the substrate 20 and the second connector 22b. For example, an active element may not be provided between the memory controller 32 and the main memory 40. The signal lines between the memory controller 32 and the main memory 40 may be composed of passive elements only.

The main memory 40 may receive the first to fourth signals S1 to S4 from the second connector 22b. For example, the signal line closest to a specific signal line may mainly cause crosstalk in the specific signal line. The arrangements of the signal lines of the first to fourth signals S1 to S4 may be changed while passing through the first connector 22a, the substrate 20, and the second connector 22b.

In example embodiments, in the second connector 22b or the main memory 40, the signal line of the first signal S1 may be closest to the signal line of the second signal S2 and the signal line of the fourth signal S4. The signal line of the second signal S2 may be closest to the signal line of the first signal S1 and the signal line of the third signal S3. The signal line of the third signal S3 may be closest to the signal line of the second signal S2 and the signal line of the fourth signal S4. The signal line of the fourth signal S4 may be closest to the signal line of the first signal S1 and the signal line of the third signal S3.

In the board 20, the signal line of the first signal S1 may be closest to the signal line of the second signal S2 and the signal line of the third signal S3. The signal line of the second signal S2 may be closest to the signal line of the first signal S1 and the signal line of the fourth signal S4. The signal line of the third signal S3 may be closest to the signal line of the first signal S1 and the signal line of the fourth signal S4. The signal line of the fourth signal S4 may be closest to the signal line of the second signal S2 and the signal line of the third signal S3.

In the memory controller 32 or the first connector 22a, the signal line of the first signal S1 may be closest to the signal line of the third signal S3 and the signal line of the fourth signal S4. The signal line of the second signal S2 may be closest to the signal line of the third signal S3 and the signal line of the fourth signal S4. The signal line of the third signal S3 may be closest to the signal line of the first signal S1 and the signal line of the second signal S2. The signal line of the fourth signal S4 may be closest to the signal line of the first signal S1 and the signal line of the second signal S2

When the signal lines closest to a specific signal line vary according to the location of the specific signal line, signal lines mainly causing crosstalk in the specific signal line may vary depending on the location of the specific signal line. Accordingly, by only providing capacitive coupling between the closest signal lines in the main memory 40, crosstalk may not be effectively prevented.

Figure 4:
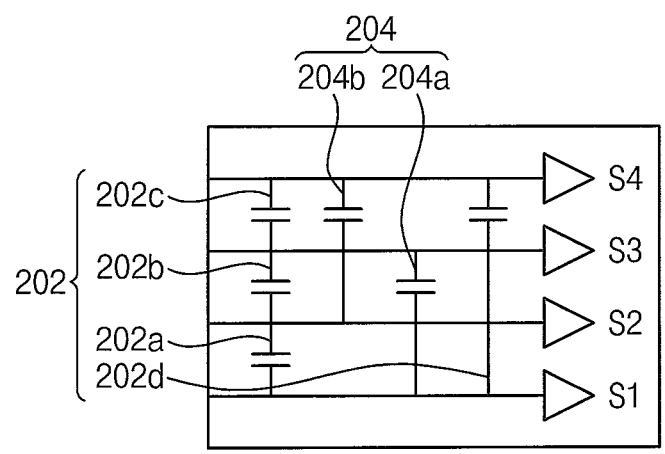
Figure 5:
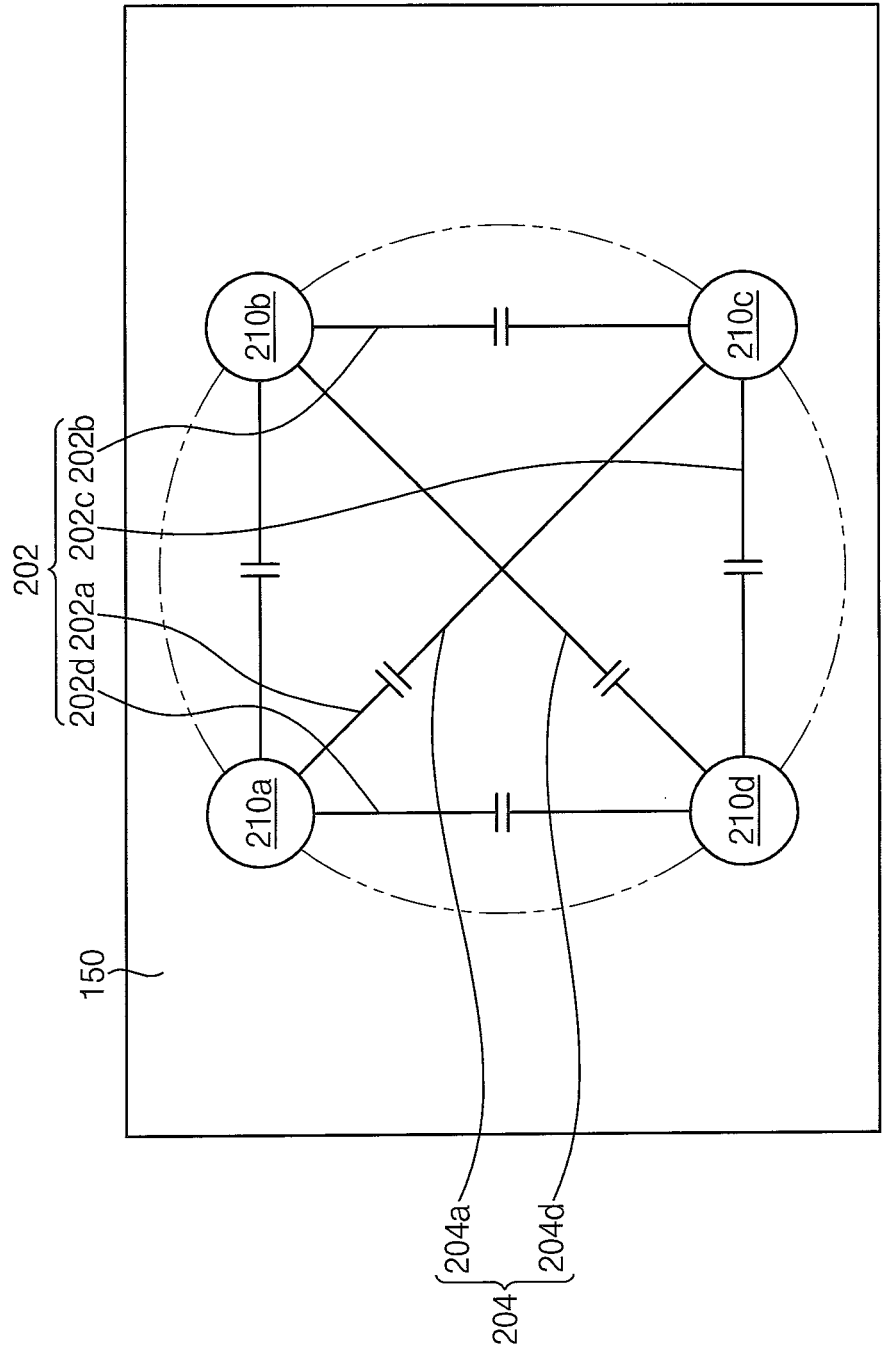
Figure 6:
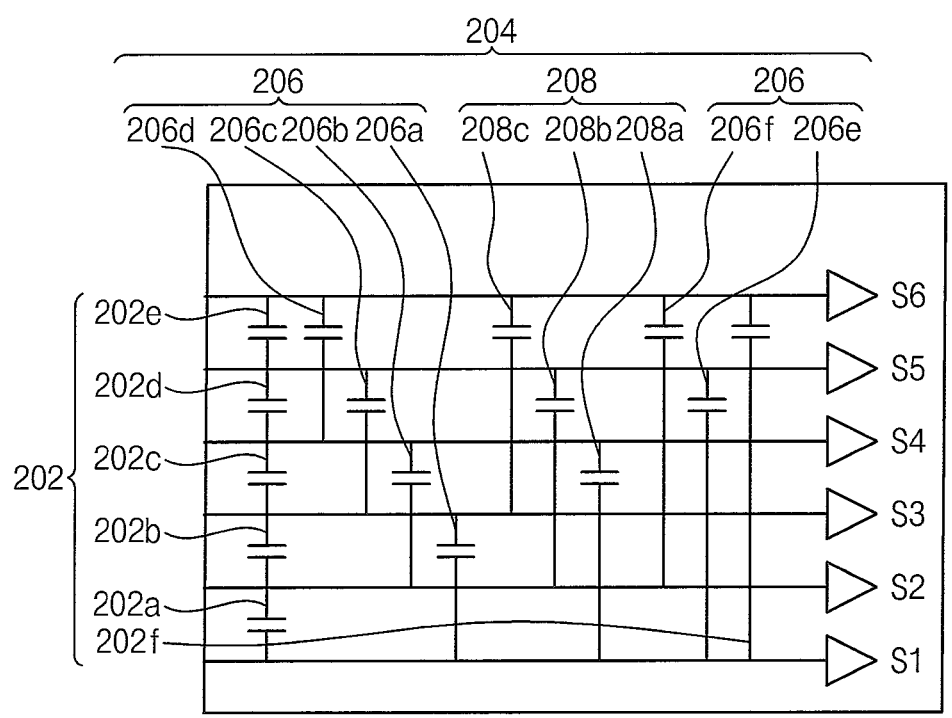
Figure 7:
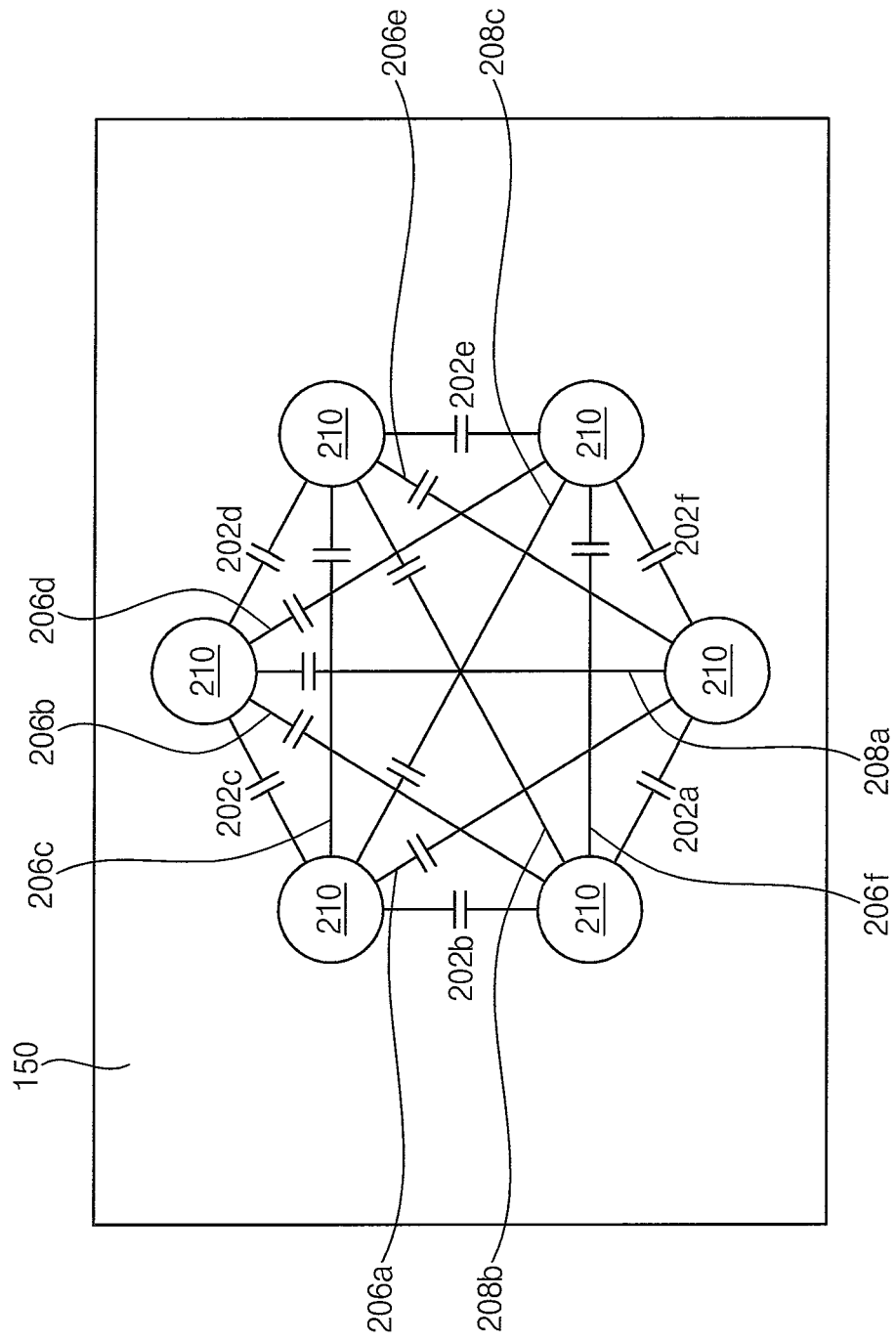

FIG. 4 is a circuit diagram illustrating a signal combiner in FIG. 1 in accordance with example embodiments. FIG. 5 is a diagram illustrating an arrangement of signals in FIG. 4 in accordance with example embodiments. FIG. 6 is a circuit diagram illustrating the signal combiner in FIG. 1 in accordance with example embodiments. FIG. 7 is a diagram illustrating an arrangement of signals in FIG. 6 in accordance with example embodiments.

Referring to FIGS. 4 to 7, a signal coupler 200 may include a first coupling element 202 and a second coupling element 204. The signal coupler 200 may be referred to as a capacitor element that provides capacitive coupling using a capacitor. The first and second coupling elements 202 and 204 may provide the capacitive coupling when signals traveling within the signal lines have different phases (even/odd).

The first coupling element 202 may include capacitors (202a, 202b, 202c and 202d) that provide capacitive coupling between signal lines that are provided adjacent to each other in the main memory 40. The second element 204 may include capacitors (204a and 204b) that provide capacitive coupling between signal lines that are not adjacent to each other. That is, the second coupling element 204 may provide the capacitive coupling between the signal lines with other signal lines positioned therebetween. Accordingly, when another signal line is positioned between two signal lines, it may be defined that the two signal lines are not adjacent to each other.

As illustrated in FIG. 5, the signal lines may include a plurality of vias 210 that transmit signals in the main memory 40. For example, the plurality of vias may include a first via 210a, a second via 210b, a third via 210c and a fourth via 210d. The plurality of vias 210 may at least partially penetrate a plurality of insulating layers constituting the substrate 150. The plurality of vias 210 may include N vias. The N vias may transmit N signals, respectively. The N vias may be arranged in a regular N-sided polygon shape when viewed from a plan view. The N-sided polygon may be a convex polygon. Accordingly, the N vias may be respectively located at vertices of the polygon. The number of the N vias may be within a range of 4 to 8.

According to an example embodiment, one signal may be transmitted through one via 210. Accordingly, when N vias 210 are provided, N signals may be transmitted. As the N vias 210 are arranged along a circumferential direction at predetermined intervals, the N vias 210 may form a N-side polygon shape. When the two vias 210 are sequentially provided along the N-sides polygon shape, it may be defined that the two vias 210 are adjacent to each other. When the two vias 210 are not sequentially provided along the N side shape, it may be defined that the two vias 210 are not adjacent to each other. For example, the arrangement of the first via 210a, the second via 210b, the third via 210c and the fourth via 210d form a four-sided shape (i.e., a square or a rectangle).

The plurality of vias 210 may include first and second vias adjacent to each other and third and fourth vias not adjacent to each other. The first via and the second via may be sequentially provided along the N-side polygon shape. The third via and the fourth via may be not sequentially provided along the N-sided polygon shape. Accordingly, the first coupling element 202 may provide the capacitive coupling between the first and second vias adjacent to each other. The second coupling element 204 may provide the capacitive coupling between the third and fourth vias that are not adjacent to each other.

For example, the plurality of vias 210 may include first to fourth through-vias 210a, 210b, 210c, and 210d. The vias 210 may be provided as many as the number of signals transmitted to the main memory 40. The vias 210 may receive the capacitive coupling from the first coupling element 202 and the second coupling element 204.

The first to fourth through-vias 210a to 210d may be provided in a rectangular shape inside the substrate 150 of the main memory 40. The first to fourth through-vias 210a to 210d may be provided to be spaced apart from each other by a predetermined distance. The first to fourth through-vias 210a to 210d may be provided in the order of a first through-via 210a, a second through-via 210b, a third through-via 210c and a fourth through-via 210d in the main memory 40 along the rectangular shape.

The first through-via 210a and the second through-via 210b may be provided adjacent to each other. Accordingly, the first through-via 210a and the second through-via 210b may have a relationship between the first and second vias. The first coupling element 202a may provide capacitive coupling between the first through-via 210a and the second through-via 210b provided adjacent to each other.

The second through-via 210b and the third through-via 210c may be provided adjacent to each other. Accordingly, the second through-via 210b and the third through-via 210c may have a relationship between the first and second vias. The first coupling element 202b may provide capacitive coupling between the second through-via 210b and the third through-via 210c provided adjacent to each other.

The third through-via 210c and the fourth through-via 210d may be provided adjacent to each other. Accordingly, the third through-via 210c and the fourth through-via 210d may have a relationship between the first and second vias. The first coupling element 202c may provide capacitive coupling between the third through-via 210c and the fourth through-via 210d provided adjacent to each other.

The fourth through-via 210d and the first through-via 210a may be provided adjacent to each other. Accordingly, the fourth through-via 210d and the first through-via 210a may have a relationship between the first and second vias. The first coupling element 202d may provide capacitive coupling between the fourth through-via 210d and the first through-via 210a provided adjacent to each other.

The first through-via 210a and the third through-via 210c may be provided not to be adjacent to each other. Accordingly, the first through-via 210a and the third through-via 210c may have a relationship between the third and fourth vias. The second coupling element 204a may provide capacitive coupling between the first through-via 210a and the third through-via 210c provided not adjacent to each other.

The second through-via 210b and the fourth through-via 210d may be provided not to be adjacent to each other. Accordingly, the second through-via 210b and the fourth through-via 210d may have a relationship between the third and fourth vias. The second coupling element 204b may provide capacitive coupling between the second through-via 210b and the fourth through-via 210d provided not adjacent to each other.

For example, capacitive coupling may be provided not only between the adjacent signal lines, but also between the signal lines with a certain numbers of signal lines interposed therebetween. Accordingly, even if the arrangement of the signal lines is changed outside the main memory 40, the crosstalk between the signal lines may be prevented. If the signal lines between the memory controller 32 and the main memory 40 are composed of passive elements, crosstalk of the entire signal lines between the memory controller 32 and the main memory 40 may be prevented by the signal combiner of the main memory 40.

Illustratively, the signal coupler 200 according to example embodiments has been described with reference to four signal lines. However, the signal coupler 200 may not be limited thereto.

As illustrated in FIGS. 6 and 7, the signal coupler 200 may include the first coupling element 202 and the second coupling element 204. The signal coupler 200 may further include the third coupling element 206 and the fourth coupling element 208. The first to fourth coupler elements 202, 204, 206, and 208 may provide capacitive coupling even though signals traveling in the signal lines have different phases (even/odd). According to an example embodiment, the first coupling element 202 may include capacitors 202a, 202b, 202c, 202d, 202e and 202f that provide capacitive coupling between signal lines that are provided adjacent to each other in the main memory 40. Moreover, the third coupling element 206 may include capacitors 206a, 206b, 206c, 206d, 206e and 206f that provide capacitive coupling between signal lines that are not adjacent to each other and the fourth coupling element 208 may include capacitors 208a, 208b and 208c that provide capacitive coupling between signal lines that are not adjacent to each other.

The signal lines may mean a plurality of vias which may transmit signals in the main memory 40. The first coupling element 202 may provide capacitive coupling between the vias provided adjacent to each other. The second coupling element 204 may provide capacitive coupling between the vias provided not adjacent to each other. The third coupling element may provide capacitive coupling between signal lines with one signal line interposed therebetween. The fourth coupling element may provide capacitive coupling between signal lines with two signal lines interposed therebetween.

For example, the signal lines closest to each other may have a first-order degree of adjacency. The signal lines with one signal line interposed therebetween may have a second-order degree of adjacency. The signal lines with two signal lines interposed therebetween may have a third-order degree of adjacency.

In order to prevent the complexity and cost of the main memory 40 from increasing excessively, the order of the degree of adjacency of the signal lines between which the signal combiner 200 provides the capacitive coupling may be limited. For example, the signal coupler 200 may provide capacitive coupling up to signal lines having a second-order degree of adjacency and may not provide capacitive coupling to signal lines having a degree of adjacency greater than a third-order. The signal coupler 200 may provide capacitive coupling up to signal lines having a third-order degree of adjacency and may not provide capacitive coupling to signal lines having a degree of adjacency greater than a fourth degree.

When the signal coupler 200 provides coupling capacitance up to signal lines having an I-order (I may be a positive integer) degree of adjacency, I signal lines adjacent to each other may be completely capacitive coupled to each other. That is, the signal coupler 200 may be configured to provide full (or multi-order) capacitive coupling in I-order degree of adjacency.

When the main memory 40 communicates with the memory controller 32 via N signal lines, the signal coupler 200 may provide multi-order capacitive coupling between the Kth signal line (K may be a positive integer less than N) and the K+Ith signal line. K may be a number increasing from 1 to N−I.

Figure 8:
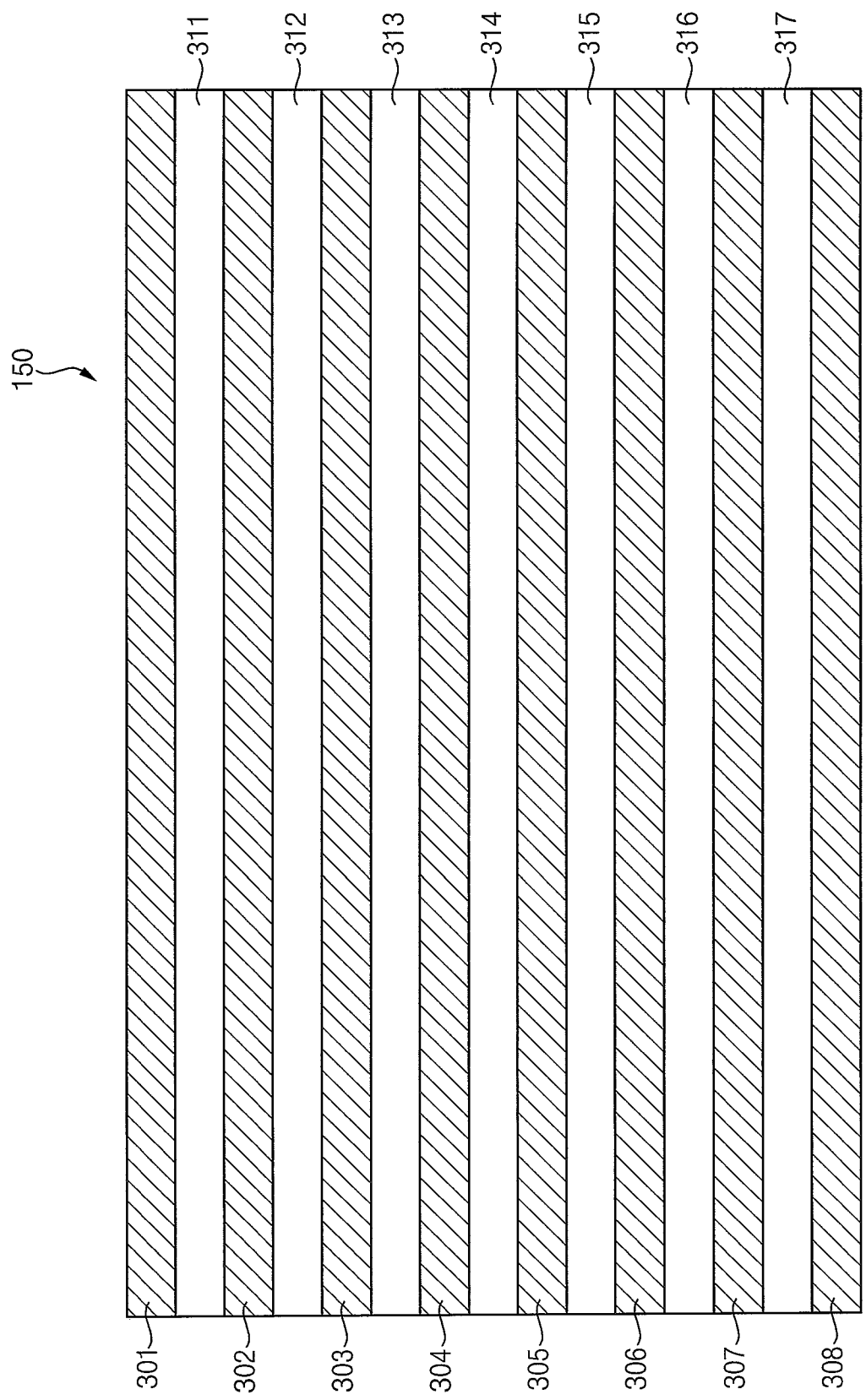
Figure 9:
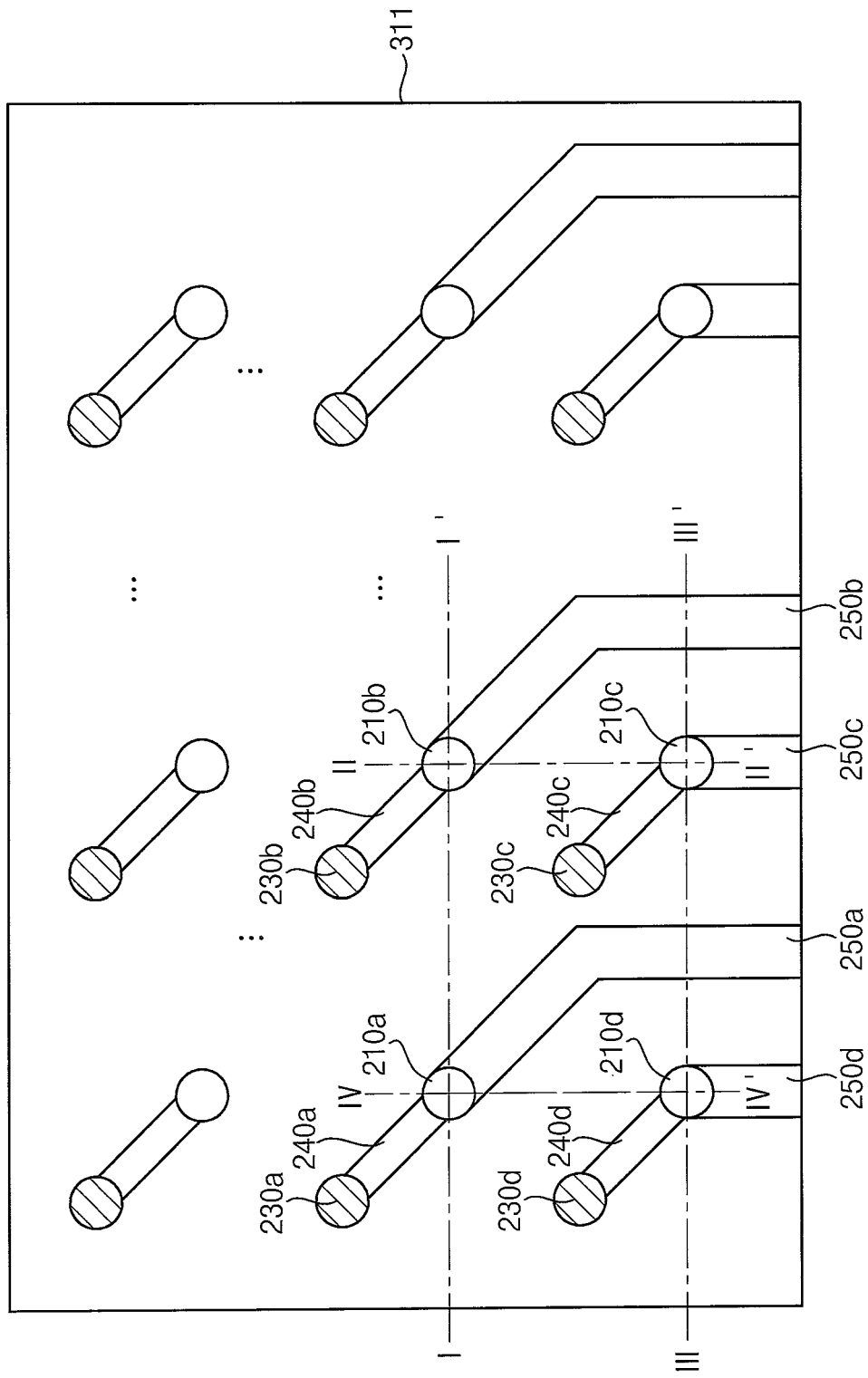
Figure 10:
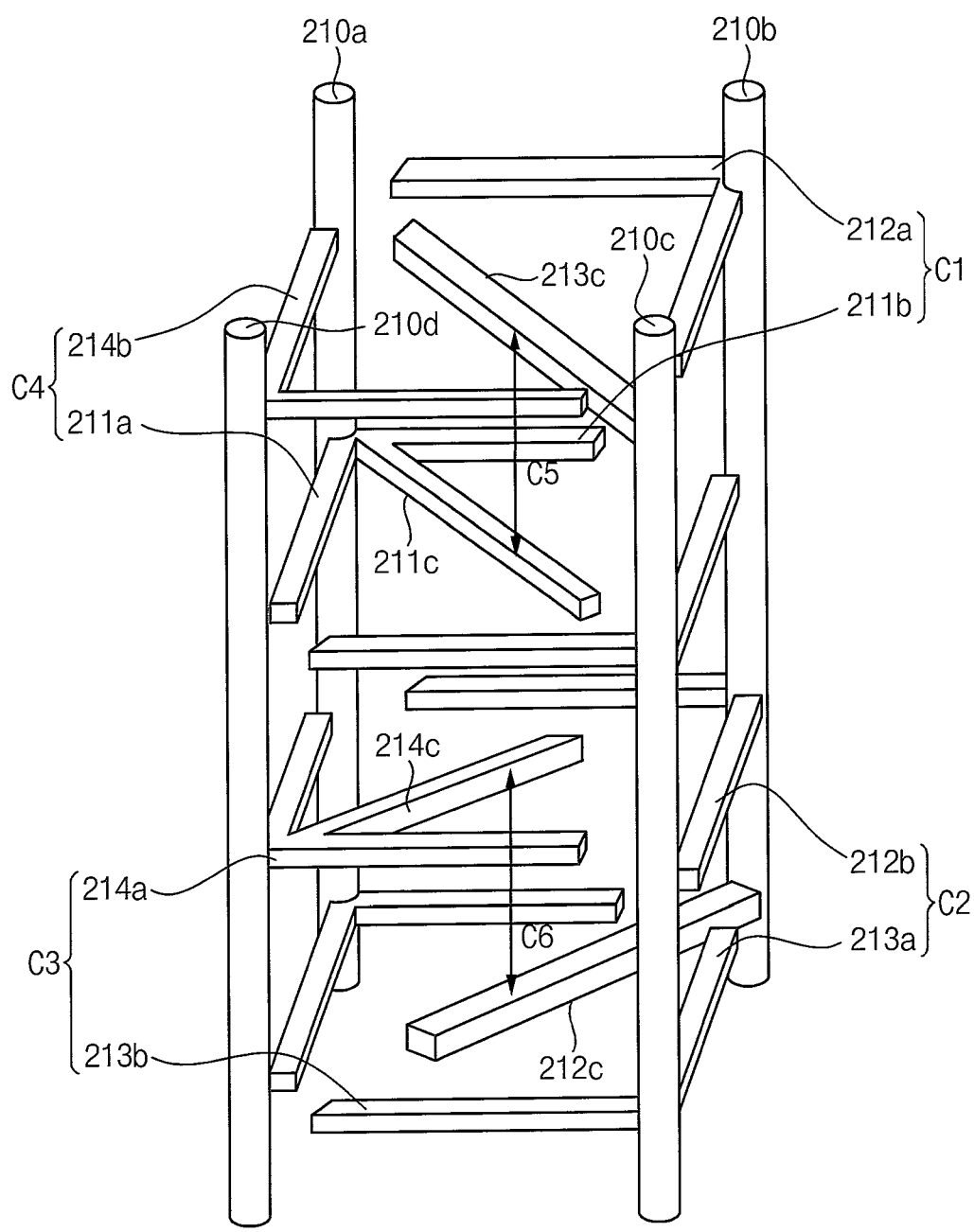
Figure 11:
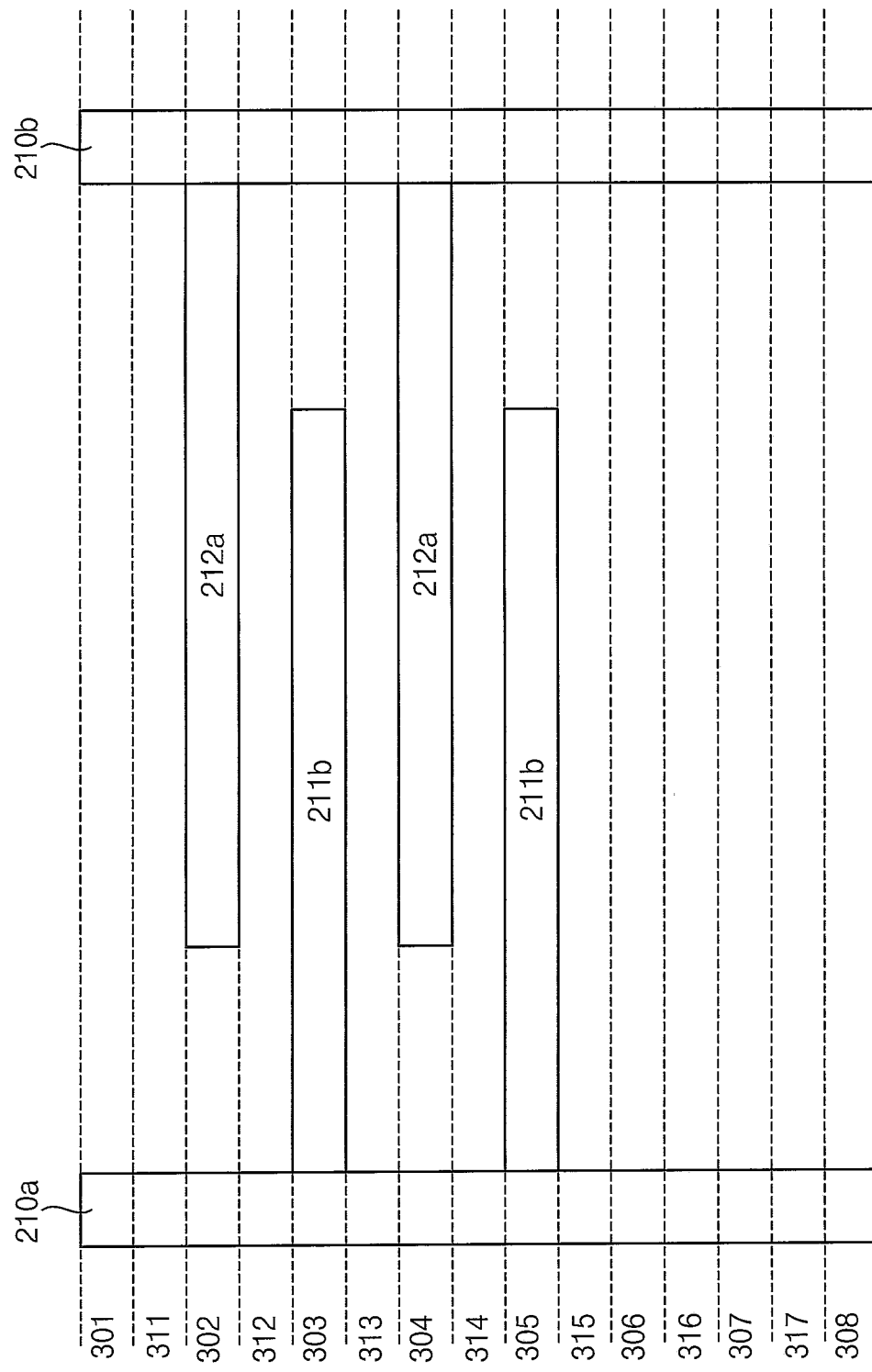
Figure 12:
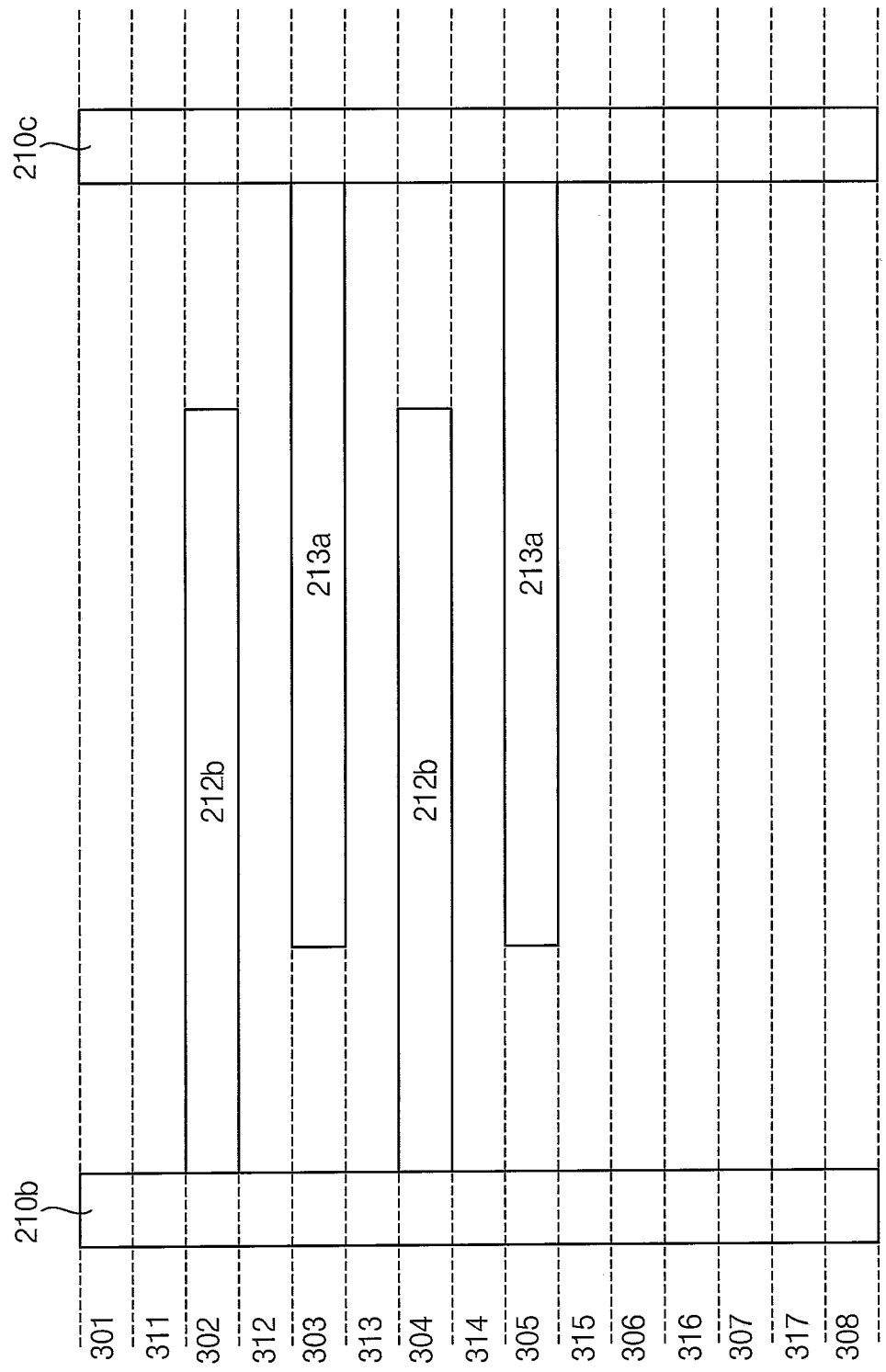
Figure 13:
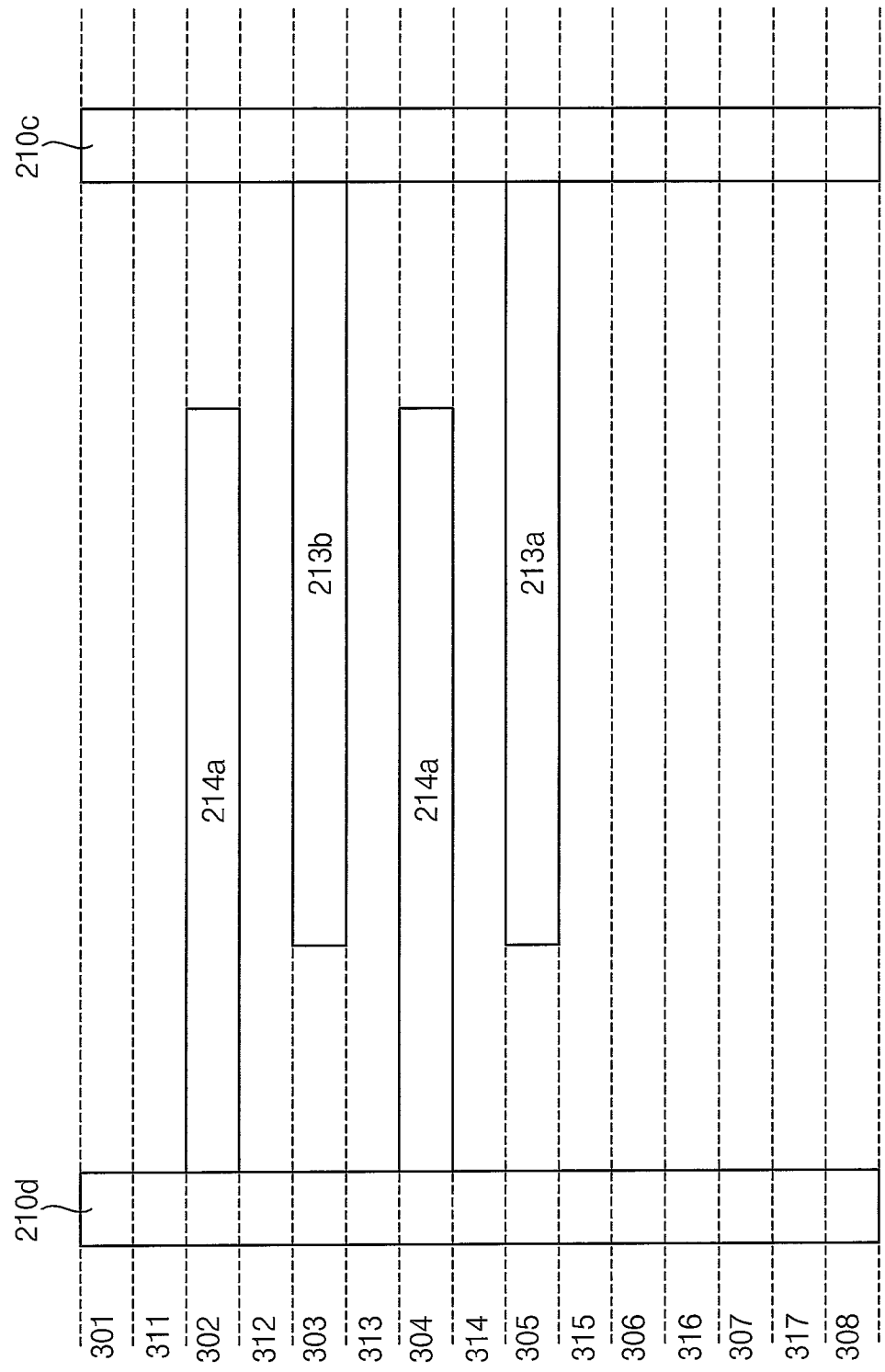
Figure 14:
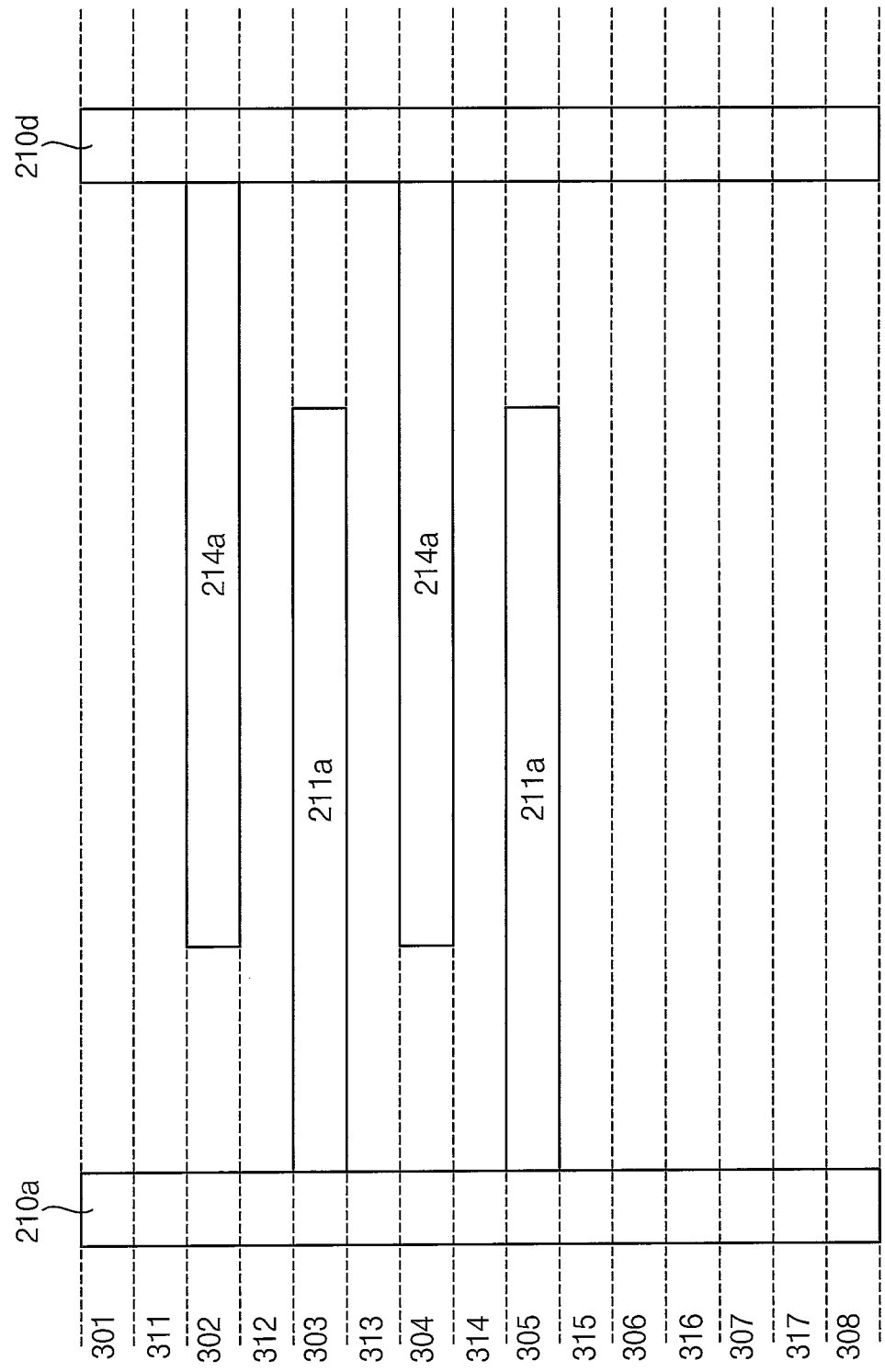

FIG. 8 is a cross-sectional view illustrating layers of a substrate in accordance with example embodiments. FIG. 9 is a plan view illustrating an attachment region for vias in accordance with example embodiments. FIG. 10 is a perspective view illustrating capacitive couplings in accordance with example embodiments. FIG. 11 is a longitudinal cross-sectional view taken along the line I-I' in FIG. 9. FIG. 12 is a longitudinal cross-sectional view taken along the line II-IF in FIG. 9. FIG. 13 is a longitudinal cross-sectional view taken along the line III-III' in FIG. 9. FIG. 14 is a longitudinal cross-sectional view taken along the line IV-IV' in FIG. 9.

Referring to FIG. 8, the substrate 150 may include first to fifteenth layers 301 to 317. The layers 301, 302, 303, 304, 305, 306, 307 and 308 (hatched with diagonal lines) may be conductive layers on which conductive patterns are provided. For example, the conductive patterns may include conductive patterns or copper foil patterns. The conductive patterns may include the signal lines and the signal coupler 200. The layers 311, 312, 313, 314, 315, 316 and 317 (not hatched with diagonal lines) may be layers including an insulating material on which the conductive patterns are be provided or attached. For example, the layers including the insulating material may include insulating layers or copper foil layers.

The degree of adjacency and the adjacency relationship of the signal lines may be defined in at least one of the conductive layers 301, 302, 303, 304, 305, 306, 307 and 308. For example, the degree of adjacency and the adjacency relationship of the signal lines may be defined in the conductive layer among the conductive layers 301, 302, 303, 304, 305, 306, 307 and 308 in which all signal lines are provided.

Referring to FIGS. 2, 8 and 9, the substrate 150 may have an attachment region in which semiconductor memory packages are directly connected to signal lines connected to the second connector 22b. For example, the attachment region of the semiconductor memory module 100 described with reference to FIG. 2 may be provided to the controller 110 and the data buffers 140.

The semiconductor memory module 100 may be based on a Load Reduced Dual In-Line Memory Module (LRDIMM). When the semiconductor memory module 100 is based on a registered DIMM (RDIMM), the data buffers 140 may be removed. The external data signals DQe and the external data strobe signals DQSe may be directly provided to the first memory devices 120 and the second memory devices 130. In case of the RDIMM, the attachment region may be provided to the controller 110, the first memory devices 120 and the second memory devices 130.

When the semiconductor memory module 100 is based on a DIMM, the data buffers 140 and the controller 110 may be removed from the semiconductor memory module 100. The external address ADDRe, the external command CMDe, and the external control signals CTRLe may be directly provided to the first memory devices 120 and the second memory devices 130. Based on the DIMM, the attachment region may be provided to the first memory devices 120 and the second memory devices 130.

The attachment region of the second layer 311 may include conductive patterns provided on the second layer 311, which is the insulating layer of the substrate 150. The conductive patterns may form the first layer 301, which is the conductive layer of the substrate 150.

The conductive patterns may include attachment patterns (for example, bonding pads) to which solder balls of a semiconductor memory package are attached. The attachment patterns may be arranged in a matrix along a first direction (X) and a second direction (Y). For a description of the signal combiner 200, first to fourth attachment patterns 230a, 230b, 230c, and 230d of the attachment patterns may be referred to as different reference numbers.

The first to fourth attachment patterns 230a, 230b, 230c, and 230d may be connected to the first to fourth through-vias 210a, 210b, 210c, and 210d through first to fourth intermediate patterns 240a, 240b, 240c, and 240d, respectively. The first to fourth through vias 210a, 210b, 210c, and 210d may be arranged in a matrix along the first direction (X) and the second direction (Y). The first to fourth through vias 210a, 210b, 210c, and 210d may penetrate the first to fifteenth layers 301 to 317 of the substrate 150 in a direction perpendicular to the top or bottom surface of the substrate 150.

The first to fourth through-vias 210a, 210b, 210c, and 210d may be connected to the first to fourth signal patterns 250a, 250b, 250c, and 250d, respectively. The first to fourth signal patterns 250a, 250b, 250c, and 250d may be connected to the second connector 22b by routing in the first to fifteenth layers 301 to 317 of the substrate 150 or some of them.

Referring to FIGS. 10 to 14, a plurality of vias 210a, 210b, 210c and 210d and a plurality of coupling patterns 211, 212, 213 and 214 may form the capacitive coupling. The vias 210a, 210b, 210c and 210d may at least partially penetrate the substrate 150 in a stacking direction of the first to fifteenth layers 301 to 317. The vias 210a, 210b, 210c and 210d may be arranged in the N-side polygon shape. The coupling patterns 211, 212, 213 and 214 may branch from the vias 210a, 210b, 210c, and 210d toward different vias to provide capacitive coupling between the signal lines. For example, the N-sided polygon shape may be set according to the required degree of capacitive coupling between the signal lines.

The capacitive coupling may be formed by the first coupling element 202 and the second coupling element 204. The first coupling element 202 may include a first capacitive pattern extending from a first via toward a second via and a second capacitive pattern extending from the second via toward the first via. The second coupling element 204 may include a third capacitive pattern extending from a third via toward a fourth via and a fourth capacitive pattern extending from the fourth via toward the third via.

The first and second capacitive patterns may be respectively located in different layers in the plurality of conductive layers 301, 302, 303, 304, 305, 306, 307 and 308, and may have regions overlapping each other in a plan view.

The third and fourth capacitive patterns may be respectively located in different layers in the plurality of conductive layers 301, 302, 303, 304, 305, 306, 307 and 308, and may have regions overlapping each other in a plan view.

For example, the first and second capacitance patterns may extend in a first insulating layer, and the second capacitive pattern may extend in a second insulating layer, and the fourth capacitance pattern may extend from in an insulating layer.

The first capacitive pattern may have a first length, and the second capacitive pattern may have a second length different from the first length. The third capacitive pattern may have a third length different from the first and second lengths, and the fourth capacitive pattern may have a fourth length different from the first to third lengths.

The first capacitance pattern may have a first width, and the second capacitance pattern may have a second width different from the first width. The third capacitance pattern may have a third width different from the first and second widths, and the fourth capacitance pattern may have a fourth width different from the first to third widths.

For example, the first to fourth capacitive patterns may have different first to fourth lengths, and the first to fourth capacitive patterns may have different first to fourth widths. Therefore, the first to fourth capacitive patterns may implement various combinations of capacitive coupling.

The first to fourth capacitance patterns may extend inside the N-sided polygon shape. Accordingly, the first to fourth capacitive patterns implement various combinations of capacitive coupling within the first to fourth capacitive patterns irrespective of other through-vias 210 penetrating the inside of the substrate 150, and may increase the efficiency of capacitive coupling.

The first coupling pattern 211 may branch from the first through-via 210a toward other through-vias 210b, 210c, and 210d. A first coupling pattern 211b may form a first capacitor C1 with a second coupling pattern 212a. Since the first and second through-vias 210a and 210b are sequentially arranged to be adjacent with each other, the first and second coupling patterns 211b and 212a may be referred to as the first and second capacitive patterns. A first coupling pattern 211a may form a fourth capacitor C4 with a fourth coupling pattern 214b. Since the first and fourth through-vias 210a and 210d are sequentially arranged to be adjacent with each other, the first and second coupling patterns 211a and 214b may be referred to as the first and second capacitive patterns. A first coupling pattern 211c may form a fifth capacitor C5 with a third coupling pattern 213c. Since the first and third through-vias 210a and 210c are not sequentially arranged to be adjacent with each other, the first and third coupling patterns 211c and 213c may be referred to as the third and fourth capacitive patterns.

The second coupling pattern 212 may branch from the second through-via 210b toward other through-vias 210a, 210c, and 210d. A second coupling pattern 212b may form a second capacitor C2 with a third coupling pattern 213a. Since the second and third through-vias 210b and 210c are sequentially arranged to be adjacent with each other, the second and third coupling patterns 212b and 213a may be referred to as the first and second capacitive patterns. The second coupling pattern 212a may form the first capacitor C1 with the first coupling pattern 211b. A second coupling pattern 212c may form a sixth capacitor C6 with a fourth coupling pattern 214c. Since the second and fourth through-vias 210b and 210d are not sequentially arranged to be adjacent with each other, the second and fourth coupling patterns 212c and 214c may be referred to as the third and fourth capacitive patterns.

The third coupling pattern 213 may branch from the third through-via 210c toward other through-vias 210a, 210b, and 210d. The third coupling pattern 213b may form a third capacitor C3 with a fourth coupling pattern 214a. Since the third and fourth through-vias 210c and 210d are sequentially arranged to be adjacent with each other, the third and fourth coupling patterns 213b and 214a may be referred to as the first and second capacitive patterns. The third coupling pattern 213a may form a second capacitor C2 with the second coupling pattern 212b. The third coupling pattern 213c may form a fifth capacitor C5 with the first coupling pattern 211c.

The fourth coupling pattern 214 may branch from the fourth through-via 210d toward other through-vias 210a, 210b, and 210c. The fourth coupling pattern 214b may form a fourth capacitor C4 with the first coupling pattern 211a. The fourth coupling pattern 214a may form a third capacitor C3 with the third coupling pattern 213b. The fourth coupling pattern 214c may form a sixth capacitor C6 with the second coupling pattern 212c.

For example, the first capacitor C1 may correspond to the first coupling element 202a of FIG. 5. The second capacitor C1 may correspond to the first coupling element 202b of FIG. 5. The third capacitor C3 may correspond to the first coupling element 202c of FIG. 5. The fourth capacitor C1 may correspond to the first coupling element 202d of FIG. 5. The fifth capacitor C5 may correspond to the second coupling element 204a of FIG. 5. The sixth capacitor C6 may correspond to the second coupling element 204b of FIG. 5.

The coupling patterns 211, 212, 213, 214 may be branched between two different vias in any combination to provide the capacitive coupling between all the signal lines. Alternatively, the coupling patterns 211, 212, 213, and 214 may be branched between two different vias of a combination selected according to the required degree of capacitive coupling between the signal lines.

Referring to FIGS. 9 and 11, the first coupling pattern 211b may extend from the first through-via 310a in the fifth layer 303 and the ninth layer 305 that are the conductive layers. The second coupling pattern 212a may extend from the second through via 210b in the third layer 302 and the seventh layer 304 that are the conductive layers.

The first coupling pattern 211b and the second coupling pattern 212a may have regions overlapping each other along a direction perpendicular to the upper surface or the lower surface of the module substrate 150. The first coupling pattern 211b and the second coupling pattern 212a may form capacitive coupling. That is, the first coupling pattern 211b and the second coupling pattern 212a may form a capacitor providing capacitive coupling between the first and second signal patterns 250a and 250b provided adjacent to each other.

Referring to FIGS. 9 and 12, the second coupling pattern 212b may extend from the second through via 210b in the third layer 302 and the seventh layer 304 that are the conductive layers. The third coupling pattern 213a may extend from the third through via 210c in the fifth layer 303 and the ninth layer 305 that are the conductive layers.

The second coupling pattern 212b and the third coupling pattern 213a may have regions overlapping each other along the direction perpendicular to the upper surface or the lower surface of the substrate 150. The second coupling pattern 212b and the third coupling pattern 213a may form capacitive coupling. That is, the second coupling pattern 212b and the third coupling pattern 213a may form a capacitor providing capacitive coupling between the second and third signal patterns 250b and 250c provided adjacent to each other.

Referring to FIGS. 9 and 13, the fourth coupling pattern 214a may extend from the fourth through via 210d in the third layer 302 and the seventh layer 304 that are the conductive layers. The third coupling pattern 213b may extend from the third through-via 210c in the fifth layer 303 and the ninth layer 305 that are the conductive layers.

The third coupling pattern 213b and the fourth coupling pattern 214a may have regions overlapping each other along the direction perpendicular to the upper surface or the lower surface of the substrate 150. The third coupling pattern 213b and the fourth coupling pattern 214a may form capacitive coupling. That is, the third coupling pattern 213b and the fourth coupling pattern 214a may form a capacitor providing capacitive coupling between the third and fourth signal patterns 250c and 250d provided adjacent to each other.

Referring to FIGS. 9 and 14, the first coupling pattern 211a may extend from the first through-via 210a in the fifth layer 303 and the ninth layer 305 that are the conductive layers. A fourth coupling pattern 214b may extend from the fourth through via 210d in the third layer 302 and the seventh layer 304 that are the conductive layers.

The first coupling pattern 211a and the fourth coupling pattern 214b may have regions overlapping each other along the direction perpendicular to the upper surface or the lower surface of the substrate 150. The first coupling pattern 211a and the fourth coupling pattern 214b may form capacitive coupling. That is, the first coupling pattern 211a and the fourth coupling pattern 214b may form a capacitor providing capacitive coupling between the first and fourth signal patterns 250a and 250d provided adjacent to each other.

Figure 15:
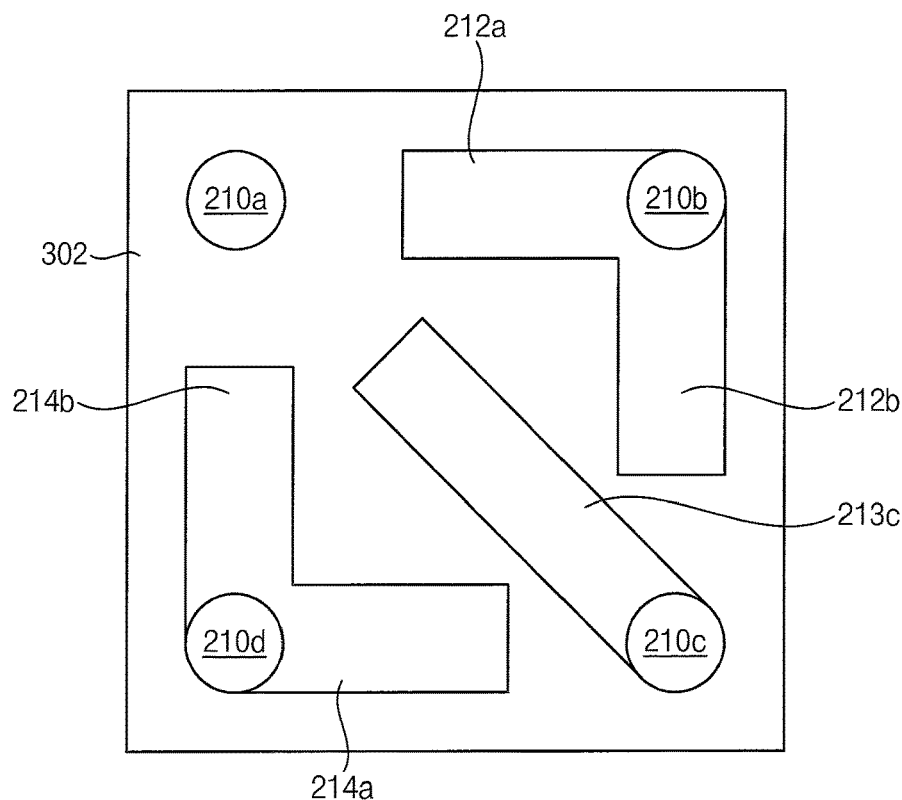

Referring to FIGS. 8 and 15, the conductive patterns of the third layer 302 may be formed on the fourth layer 312 that is the insulating layer. The second coupling pattern 212 may extend from the second through via 210b. The second coupling pattern 212 may include first and second portions 212a and 212b respectively extending in two directions. The fourth coupling pattern 214 may extend from the fourth via 210d. The fourth coupling pattern 214 may include first and second portions 214a and 214b respectively extending in two directions. The third coupling pattern 213 may extend from the third via 210c. The third coupling pattern 213 may include a third portion 213c extending in one direction.

The first to third portions 212a, 212b, 214a, 214b, 213c may form capacitive coupling together with the first to fourth coupling patterns 211, 212, 213 and 214 of the first to fourth through vias 210a, 210b, 210c and 210d located in different conductive layers. For example, the first to fourth through vias 210a, 210b, 210c and 210d may form capacitive coupling with each other and may not form capacitive coupling with other external vias.

Figure 16:
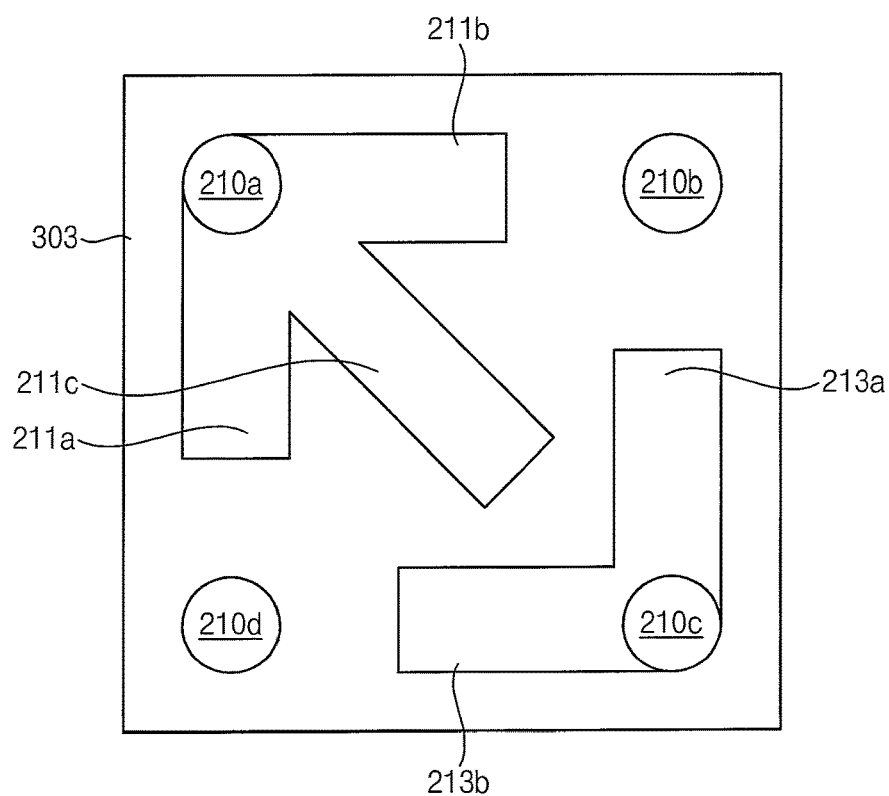

Referring to FIGS. 8 and 16, the conductive patterns of the fifth layer 303 may be formed on the sixth layer 313 that is the insulating layer. The first coupling pattern 211 may extend from the first through via 210a. The first coupling pattern 211 may include first to third portions 211a, 211b, and 211c respectively extending in three directions. The third coupling pattern 213 may extend from the third through via 210c. The third coupling pattern 213 may include first and second portions 213a and 213b respectively extending in two directions.

The first to third portions 211a, 211b, 211c, 213a, and 213b may form capacitive coupling together with the first to fourth coupling patterns 211, 212, 213 and 214 of the first to fourth through vias 210a, 210b, 210c and 210d located in different conductive layers. For example, the first to fourth through vias 210a, 210b, 210c and 210d may form capacitive coupling with each other and may not form capacitive coupling with other external vias.

Figure 17:
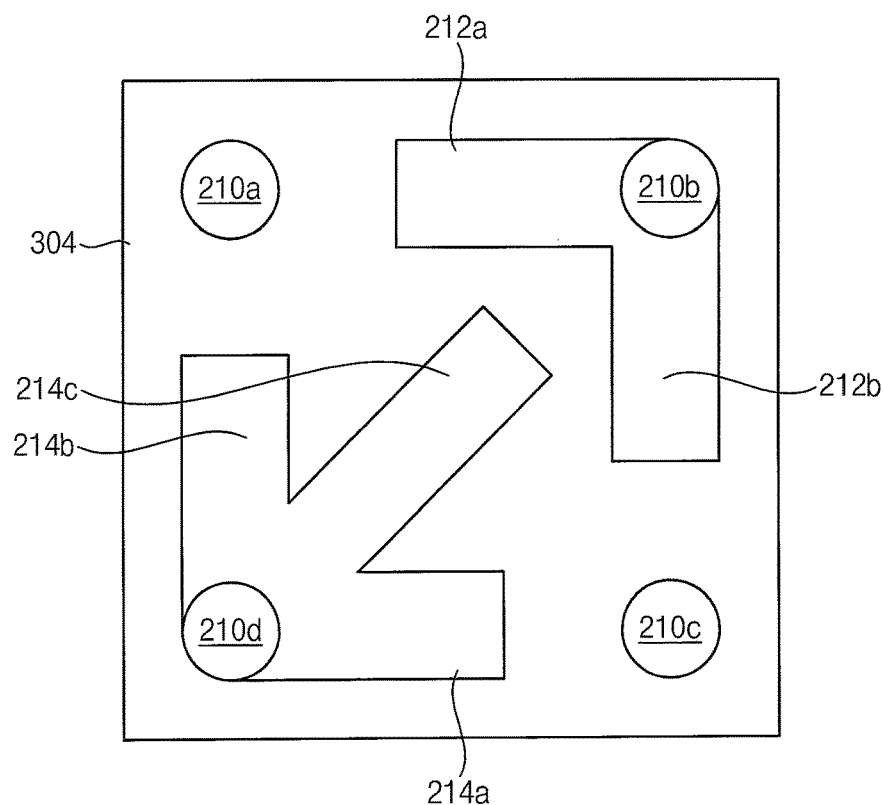

Referring to FIGS. 8 and 17, the conductive patterns of the seventh layer 304 may be formed on the eighth layer 314 that is the insulating layer. The fourth coupling pattern 214 may extend from the fourth through via 210d. The fourth coupling pattern 214 may include first to third portions 214a, 214b and 214c respectively extending in three directions. The second coupling pattern 212 may extend from the second through-via 210b. The second coupling pattern 212 may include first and second portions 212a and 212b respectively extending in two directions.

The first through third portions 214a, 214b, 214c, 212a and 212b may form capacitive coupling together with the first to fourth coupling patterns 211, 212, 213 and 214 of the first to fourth through vias 210a, 210b, 210c and 210d located in different conductive layers. For example, the first to fourth through vias 210a, 210b, 210c and 210d may form capacitive coupling with each other and may not form capacitive coupling with other external vias.

Figure 18:
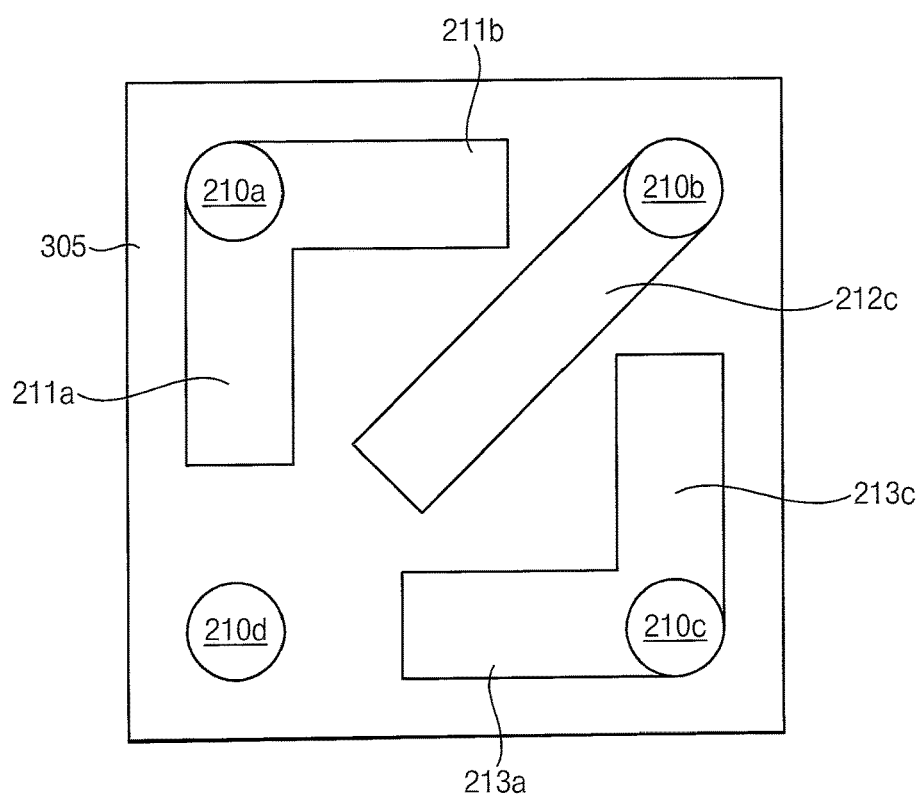

Referring to FIGS. 8 and 18, the conductive patterns of the ninth layer 305 may be formed on the tenth layer 315 that is the insulating layer. The first coupling pattern 211 may extend from the first through via 210a. The first coupling pattern 211 may include first and second portions 211a and 211b respectively extending in two directions. The third coupling pattern 213 may extend from the third through via 310c. The third coupling pattern 213 may include first and second portions 213a and 213b respectively extending in two directions. The second coupling pattern 210b may include a third portion 212c extending in one direction.

The first to third portions 211a, 211b, 213a, 313b, and 212c may form capacitive coupling together with the first to fourth coupling patterns 211, 212, 213 and 214 of the first to fourth through vias 210a, 210b, 210c and 210d located in different conductive layers. For example, the first to fourth vias 210a, 210b, 210c and 210d may form capacitive coupling with each other and may not form capacitive coupling with other external vias.

The first portion 211a of the first coupling pattern 211 may form capacitive coupling together with the second portion 214b of the fourth coupling pattern 214 and may correspond to the first device 202d of FIG. 4 that provides capacitive coupling between the first and fourth signal patterns 250a and 250d provided adjacent to each other.

The first portion 212a of the second coupling pattern 212 may form capacitive coupling together with the second portion 211b of the first coupling pattern 211, and may correspond to the first device 202a of FIG. 4 that provides capacitive coupling between the first and second signal patterns 250a and 250b provided of adjacent to each other.

The first portion 213a of the third coupling pattern 213 may form capacitive coupling with the second portion 212b of the second coupling pattern 212 and may correspond to the first device 202b of FIG. 4 that provides capacitive coupling between the second and third signal patterns 250b and 250c provided adjacent to each other.

The first portion 214a of the fourth coupling pattern 214 may form capacitive coupling together with the second portion 213b of the third coupling pattern 213, and may correspond to the first device 202c of FIG. 4 that provides capacitive coupling between the third and fourth signal patterns 250c and 250d provided adjacent to each other.

The second portion 211b of the first coupling pattern 211 may form capacitive coupling together with the first portion 212a of the second coupling pattern 212, and the second portion 211b of the first coupling pattern 211 may correspond to the first device 202a of FIG. 4 that provides capacitive coupling between the first and second signal patterns 250a and 250b provided adjacent to each other.

The second portion 212b of the second coupling pattern 212 may form capacitive coupling with the first portion 213a of the third coupling pattern 213, and the second portion 212b of the second coupling pattern 212 may correspond to the first device 202b of FIG. 4 that may provide capacitive coupling between the second and third signal patterns 250b and 250c provided adjacent to each other.

The second portion 213b of the third coupling pattern 213 may form capacitive coupling together with the first portion 214a of the fourth coupling pattern 214, and the second portion 213b of the third coupling pattern 213 may correspond to the first device 202c of FIG. 4 that provides capacitive coupling between the third and fourth signal patterns 250c and 250d provided adjacent to each other.

The second portion 214b of the fourth coupling pattern 214 may form capacitive coupling together with the first portion 211a of the first coupling pattern 211, and the second portion 214b of the fourth coupling pattern 214 may correspond to the first device 202d of FIG. 4 that provides capacitive coupling between the first and fourth signal patterns 250a and 250d provided adjacent to each other.

The third portion 210c of the first coupling pattern 210 may form capacitive coupling together with the third portion 213c of the third coupling pattern 213 and may correspond to the second element 204a of FIG. 4 which provides capacitive coupling between the second signal pattern 250b and the fourth signal pattern 250d interposed between the first and third signal patterns 250a and 250c.

The third portion 212c of the second coupling pattern 212 may form capacitive coupling together with the third portion 214c of the fourth coupling pattern 214 and may correspond to the second coupling element 204b of FIG. 4 which provides capacitive coupling between the first signal pattern 250a and the third signal pattern 250c interposed between the second and fourth signal patterns 250b and 250d.

The third portion 213c of the third coupling pattern 213 may form capacitive coupling together with the third portion 211c of the first coupling pattern 211 and may correspond to the second coupling element 204a of FIG. 4 which provides capacitive coupling between the first and third signal patterns 250a and 250c interposed between with the second signal pattern 250b and the fourth signal pattern 250d.

The third portion 214c of the fourth coupling pattern 214 may form capacitive coupling together with the third portion 212c of the second coupling pattern 212 and may correspond to the second coupling element 204b of FIG. 4 which provides capacitive coupling between the second and fourth signal patterns 250b and 250d interposed between the first signal pattern 250a and the third signal pattern 250c.

The first to fourth signal patterns 250 may form complete capacitive coupling with each other in multiple orders through the first to fourth coupling patterns 211, 212, 213 and 214 of the first to fourth through vias 210. That is, multi-order full capacitive coupling may be provided up to signal patterns with the third-order degree of adjacency.

The above-described, the first and second coupling elements 202 and 204 provided between the signal lines may form capacitive coupling between the signal lines, and may compensate for a difference in speeds of signals moving within the signal lines to improve signal characteristics. In addition, it is easy to configure a combination of the patterns, size, shape, arrangement, etc. according to the required degree of capacitive coupling, and even in a structure in which crosstalk is easily generated, and the signal may be compensated.

Example embodiments have been provided in this disclosure. Although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate for semiconductor module, comprising:
a plurality of insulating layers provided in a sequentially stacked arrangement;
N signal lines transmitting N signals respectively, the N signal lines having N vias that at least partially penetrate through the plurality of insulating layers, the N vias being arranged in an N-sided polygon shape in a plan view; and
a capacitor element configured to provide capacitive coupling between the N signal lines, the capacitor element having a first coupling element configured to provide capacitive coupling between a first via and a second via adjacent to each other among the N vias and a second coupling element configured to provide capacitive coupling between a third via and a fourth via that are not adjacent to each other among the N vias, wherein the first coupling element includes a first capacitive pattern extending from the first via toward the second via and a second capacitive pattern extending from the second via toward the first via, and the second coupling element includes a third capacitive pattern extending from the third via toward the fourth via and a fourth capacitive pattern extending from the fourth via toward the third via, wherein the first capacitive pattern and the second capacitance pattern are provided in different insulating layers of the plurality of insulating layers, and a first region of the first capacitive pattern overlaps a second region of the second capacitance pattern in the plan view, and wherein the third capacitive pattern and fourth capacitance pattern are provided in different insulating layers of the plurality of insulating layers, and a third region of the third capacitive pattern overlaps a fourth region of the fourth capacitance pattern in the plan view.

2. The substrate for semiconductor module of claim 1, wherein the first capacitive pattern, the second capacitive pattern, the third capacitive pattern and the fourth capacitive pattern extend inside the N-sided polygon shape.

3. The substrate for semiconductor module of claim 1, wherein the first capacitive pattern has a first length, and the second capacitive pattern has a second length different from the first length.

4. The substrate for semiconductor module of claim 3, wherein the third capacitive pattern has a third length different from the first length and second length, and the fourth capacitive pattern has a fourth length different from the first length, the second length and the third length.

5. The substrate for semiconductor module of claim 1, wherein the first capacitive pattern has a first width, and the second capacitive pattern has a second width different from the first width.

6. The substrate for semiconductor module of claim 5, wherein the third capacitive pattern has a third width different from the first width and the second width, and the fourth capacitive pattern has a fourth width different from the first width, the second width and the third width.

7. The substrate for semiconductor module of claim 1, wherein the first and second capacitive patterns extend in a first insulating layer respectively, the third capacitive pattern extends in a second insulating layer, and the fourth capacitive pattern extends in a third insulating layer.

8. The substrate for semiconductor module of claim 1, further comprising:
a connector provided on one side of the plurality of insulating layers and provided to be connected to an external device.

9. The substrate for semiconductor module of claim 1, the N-sided polygon is a convex polygon.

10. The substrate for semiconductor module of claim 1, wherein the number of the N vias is within the range of 4 to 8.

11. A substrate for semiconductor module, comprising:
a plurality of insulating layers sequentially arranged in a vertical direction;
N signal lines transmitting N signals respectively, the N signal lines having N vias that at least partially penetrate through the plurality of insulating layers and are arranged in an N-sided polygon shape in a plan view, N being a natural number greater than 3; and
at least one capacitor element having a first capacitive pattern extending from a first via of the N vias in a first horizontal direction and a second capacitance pattern extending from a second via of the N vias in a second horizontal direction parallel to the first horizontal direction, the first and second capacitive patterns configured to provide capacitive coupling between the first via and the second via,
wherein the first and second capacitive patterns provided in different insulating layers of the plurality of insulating layers, and the first and second capacitive patterns extend within the N-sided polygon shape in the plan view.

12. The substrate for semiconductor module of claim 11, wherein the first via and the second via, among the N vias, are adjacent to each other.

13. The substrate for semiconductor module of claim 11, wherein the first and second vias among the N vias are not the most adjacent to each other.

14. The substrate for semiconductor module of claim 11, wherein the first capacitive pattern has a first length, and the second capacitive pattern has a second length different from the first length.

15. The substrate for semiconductor module of claim 11, wherein the first capacitive pattern has a first width, and the second capacitive pattern has a second width different from the first width.

16. The substrate for semiconductor module of claim 11, wherein the N-sided polygon is a convex polygon.

17. The substrate for semiconductor module of claim 11, further comprising:
a connector provided on one side of the plurality of insulating layers and provided to be connected to an external device.

18. A semiconductor device, comprising:
a substrate having a plurality of layers stacked in a vertical direction; and
one or more memory packages provided on the substrate, wherein the substrate comprises:
a plurality of signal lines penetrating the substrate in the vertical direction, the plurality of signal lines having a plurality of vias arranged in a circumferential direction at predetermined intervals around a center of the vias; and
a first coupling element and a second coupling element configured to provide capacitive coupling between the signal lines, the first coupling element configured to provide capacitive coupling between first and second vias that are sequentially arranged to be adjacent with each other in the circumferential direction, the second coupling element configured to provide capacitive coupling between third and fourth vias that are not sequentially arranged each other in the circumferential direction,
wherein the first coupling element includes a first capacitive pattern extending from the first via toward the second via and a second capacitive pattern extending from the second via toward the first via,
wherein the second coupling element includes a third capacitive pattern extending from the third via toward the fourth via and a fourth capacitive pattern extending from the fourth via toward the third via,
wherein the first capacitive pattern and second capacitive pattern are provided in different layers of the plurality of layers and a first region of the first capacitive pattern overlaps a second region of the second capacitance pattern in the vertical direction, and wherein the third capacitive pattern and fourth capacitive pattern are provided in different layers of the plurality of layers and a third region of the third capacitive pattern overlaps a fourth region of the fourth capacitance pattern in the vertical direction.

19. The semiconductor device of claim 18, wherein the first capacitive pattern having a first length, the second capacitive pattern has a second length different from the first length, the third capacitive pattern has a third length different from the first length and second length, and the fourth capacitive pattern has a fourth length different from the first length, the second length and the third length.

20. The semiconductor device of claim 18, wherein the first capacitive pattern has a first width, the second capacitance pattern has a second width different from the first width, the third capacitive pattern has a third width different from the first width and the second width, the fourth capacitance pattern has a fourth width different from the first width, the second width and the third width.

* * * * *